(12) United States Patent
Inoue et al.

(10) Patent No.: US 9,391,598 B2
(45) Date of Patent: Jul. 12, 2016

(54) SEMICONDUCTOR DEVICE

(71) Applicant: Semiconductor Energy Laboratory Co., Ltd., Atsugi-shi, Kanagawa-ken (JP)

(72) Inventors: Hiroki Inoue, Kanagawa (JP); Kei Takahashi, Kanagawa (JP); Tatsuya Onuki, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 15/001,338

(22) Filed: Jan. 20, 2016

(65) Prior Publication Data

US 2016/0142047 A1 May 19, 2016

Related U.S. Application Data

(63) Continuation of application No. 14/199,584, filed on Mar. 6, 2014, now Pat. No. 9,245,650.

(30) Foreign Application Priority Data

Mar. 15, 2013 (JP) .................................. 2013-052787

(51) Int. Cl.
*H03L 5/00* (2006.01)
*H03K 5/24* (2006.01)

(52) U.S. Cl.
CPC .................................... *H03K 5/2481* (2013.01)

(58) Field of Classification Search
None
See application file for complete search history.

(56) References Cited

U.S. PATENT DOCUMENTS

| 5,731,856 | A | 3/1998 | Kim et al. |
| 5,744,864 | A | 4/1998 | Cillessen et al. |
| 6,049,246 | A | 4/2000 | Kozisek et al. |
| 6,294,274 | B1 | 9/2001 | Kawazoe et al. |

(Continued)

FOREIGN PATENT DOCUMENTS

| EP | 0150606 A | 8/1985 |
| EP | 1737044 A | 12/2006 |

(Continued)

OTHER PUBLICATIONS

Asakuma.N et al., "Crystallization and Reduction of Sol-Gel-Derived Zinc Oxide Films by Irradiation with Ultraviolet Lamp", Journal of Sol-Gel Science and Technology, 2003, vol. 26, pp. 181-184.

(Continued)

*Primary Examiner* — Cassandra Cox
(74) *Attorney, Agent, or Firm* — Fish & Richardson P.C.

(57) ABSTRACT

A sample-and-hold circuit including a transistor and a capacitor is connected to the differential circuit. The sample-and-hold circuit acquires voltage for correcting the offset voltage of the differential circuit by charging or discharging the capacitor through sampling operation. Then, it holds the potential of the capacitor through holding operation. In normal operation of the differential circuit, the output potential of the differential circuit is corrected by the potential held by the capacitor. The transistor in the sample-and-hold circuit is preferably a transistor whose channel is formed using an oxide semiconductor. An oxide semiconductor transistor has extremely low leakage current; thus, a change in the potential held in the capacitor of the sample-and-hold circuit can be minimized.

18 Claims, 19 Drawing Sheets

(56) References Cited

U.S. PATENT DOCUMENTS

| | | | |
|---|---|---|---|
| 6,563,174 B2 | 5/2003 | Kawasaki et al. | |
| 6,710,734 B2* | 3/2004 | Ono | H03M 1/002 327/563 |
| 6,727,522 B1 | 4/2004 | Kawasaki et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,084,700 B2 | 8/2006 | Haraguchi et al. | |
| 7,105,868 B2 | 9/2006 | Nause et al. | |
| 7,211,825 B2 | 5/2007 | Shih et al | |
| 7,253,679 B2 | 8/2007 | Nishimori | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,368,983 B2 | 5/2008 | Nishimori | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,674,650 B2 | 3/2010 | Akimoto et al. | |
| 7,732,819 B2 | 6/2010 | Akimoto et al. | |
| 7,948,304 B2 | 5/2011 | Aruga et al. | |
| 8,614,916 B2 | 12/2013 | Nagatsuka et al. | |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager, III et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0278122 A1 | 11/2009 | Hosono et al. | |
| 2009/0280600 A1 | 11/2009 | Hosono et al. | |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2011/0149185 A1* | 6/2011 | Yamazaki | H01L 27/1225 349/39 |
| 2012/0231581 A1* | 9/2012 | Yamazaki | H01L 29/78693 438/104 |
| 2012/0274361 A1 | 11/2012 | Miyake | |
| 2012/0274401 A1 | 11/2012 | Watanabe | |
| 2013/0027018 A1* | 1/2013 | Okano | H02M 3/07 323/313 |

FOREIGN PATENT DOCUMENTS

| | | |
|---|---|---|
| EP | 2226847 A | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 06-217463 A | 8/1994 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2002-319863 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 3799147 | 7/2006 |
| JP | 2006-253910 A | 9/2006 |
| JP | 2010-170470 A | 8/2010 |
| JP | 2012-239166 A | 12/2012 |
| JP | 2012-256400 A | 12/2012 |
| WO | WO-2004/093311 | 10/2004 |
| WO | WO-2004/114391 | 12/2004 |

OTHER PUBLICATIONS

Asaoka.Y et al., "29.1:Polarizer-Free Reflective LCD Combined With Ultra Low-Power Driving Technology", SID Digest '09: SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions of Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back-Plane", SID Digest '09: SID International Symposium Digest of Technical Papers, May 31, 2009, pp. 280-283.

(56) References Cited

OTHER PUBLICATIONS

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transition:The "Blue Phase "", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of the Applied Physics.

Godo.H et al., "P-9:Numerical Analysis on Temperature Dependence of Characteristics of Amorphous In—Ga—Zn—Oxide TFT", SID Digest '09: SID International Symposium Digest of Technical Papers, May 31, 2009, pp. 1110-1112.

Godo.H et al., "Temperature Dependence of Characteristics and Electronic Structure for Amorphous In—Ga—Zn—Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTs", SID Digest '08: SID International Symposium Digest of Technical Papers, May 20, 2008, vol. 39, pp. 621-624.

Hirao.T et al., "Novel Top-Gate Zinc Oxide Thin-Film Transistors (ZnO TFTs) for AMLCDS", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07: SID Internatioanl Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08: SID International Symposium Digest of Technical Papers, May 20, 2008, vol. 39, pp. 1277-1280.

Ikeda.T et al., "Full-Functional System Liquid Crystal Display Using CG-Silicon Technology", SID Digest '04: SID International Symposium Digest of the Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters), 2005, vol. 87, pp. 122102-1-122102-3.

Jeong.J et al., "3.1: Distinguished Paper: 12.1-Inch WXGA AMOLED Display Driven by Indium—Gallium—Zinc Oxide TFTs Array", SID Digest '08: SID International Symposium Digest of Tecnical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and Its Bending Properties", SID Digest '09: SID International Symposium Digest of Technical Papers, May 31, 2009, pp. 983-985.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09: SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07: SID International Symposium Digest of Techincal Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N et al., "Spinel,YbFe2O4, andYb2Fe3O7 Types of Structures for Compounds in the In2O3 and Sc2O3—A2O3—BO Systems [A; Fe, Ga, or Al; B: Mg, Mn, Fe, Ni, Cu, or Zn] at Temperatures over 1000° C.", Journal of Solid State Chemistry, 1985, vol. 60, pp. 382-384.

Kimizuka.N et al., "Syntheses and Single-Crystal Data of Homologous Compounds, In2O3(ZnO)m (m = 3, 4, and 5), InGaO3(ZnO)3, and Ga2O3(ZnO)m (m= 7, 8, 9, and 16) in the In2O3—ZnGa2O4—ZnO System", Journal Solid State Chemistry, Apr. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Journal of Solid-State Circuits, 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED ", IDW '06: Proceedings of the 13th International Display Workshops, Dec. 7, 2006, pp. 663-666.

Lee.J et al., "World's Largest (15-Inch) XGA AMLCD Panel Using IGZO Oxide TFT", SID Digest '08: SID International Symposium Digest of Technical Papers, May 20, 2008, vol. 39, pp. 625-628.

Lee.M et al., "15.4:Excellent Performance of Indium—Oxide-Based Thin-Film Transistors by DC Sputtering", SID Digest '09: SID International Symposium Digest of the Technical Papers, May 31, 2009, pp. 191-193.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Miyasaka.M, "SUFTLA Flexible Microelectronics on Their Way to Business", SID Digest '07: SID International Symposium Digest of Technical Papers, 2007, vol. 38, pp. 1673-1676.

Mo.Y et al., "Amorphous Oxide TFT Backplanes for Large Size AMOLED Displays", IDW '08: Proceedings of the 6th International Display Workshops, Dec. 3, 2008, pp. 581-584.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Nakamura.M, "Synthesis of Homologous Compound with New Long-Period Structure", NIRIM Newsletter, Mar. 1, 1995, vol. 150, pp. 1-4.

Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.

Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

(56) References Cited

OTHER PUBLICATIONS

Nomura.K et al., "Thin-Film Transistor Fabricated in Single-Crystalline Transparent Oxide Semiconductor", Science, May 23, 2003, vol. 300, No. 5623, pp. 1269-1272.
Nowatari.H et al., "60.2: Intermediate Connector With Suppressed Voltage Loss for White Tandem OLEDs", SID Digest '09: SID International Symposium Digest of Technical Papers, May 31, 2009, vol. 40, pp. 899-902.
Oba.F et al., "Defect energetics in ZnO: A hybrid Hartree-Fock density functional study", Phys. Rev. B (Physical Review. B), 2008, vol. 77, pp. 245202-1-245202-6.
Oh.M et al., "Improving the Gate Stability of ZnO Thin-Film Transistors with Aluminum Oxide Dielectric Layers", J. Electrochem. Soc. (Journal of the Electrochemical Society), 2008, vol. 155, No. 12, pp. H1009-H1014.
Ohara.H et al., "21.3:4.0 In. QVGA AMOLED Display Using In—Ga—Zn—Oxide TFTs with a Novel Passivation Layer", SID Digest '09: SID International Symposium Digest of Technical Papers, May 31, 2009, pp. 284-287.
Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.
Orita.M et al., "Amorphous transparent conductive oxide InGaO3(ZnO)m (m<4):a Zn4s conductor", Philosophical Magazine, 2001, vol. 81, No. 5, pp. 501-515.
Orita.M et al., "Mechanism of Electrical Conductivity of Transparent InGaZnO4", Phys. Rev. B (Physical Review. B), Jan. 15, 2000, vol. 61, No. 3, pp. 1811-1816.
Osada.T et al., "15.2: Development of Driver-Integrated Panel using Amorphous In—Ga—Zn—Oxide TFT", SID Digest '09: SID International Symposium Digest of Technical Papers, May 31, 2009, pp. 184-187.
Osada.T et al., "Development of Driver-Integrated Panel Using Amorphous In—Ga—Zn—Oxide TFT", AM-FPD '09 Digest of Technical Papers, Jul. 1, 2009, pp. 33-36.
Park.J et al., "Amorphous Indium—Gallium—Zinc Oxide TFTs and Their Application for Large Size AMOLED", AM-FPD '08 Digest of Technical Papers, Jul. 2, 2008, pp. 275-278.
Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.
Park.J et al., "Electronic Transport Properties of Amorphous Indium—Gallium—Zinc Oxide Semiconductor Upon Exposure to Water", Appl. Phys. Lett. (Applied Physics Letters), 2008, vol. 92, pp. 072104-1-072104-3.
Park.J et al., "High performance amorphous oxide thin film transistors with self-aligned top-gate structure", IEDM 09: Technical Digest of International Electron Devices Meeting, Dec. 7, 2009, pp. 191-194.
Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.
Park.S et al., "Challenge to Future Displays: Transparent AM-OLED Driven by Peald Grown ZnO TFT", IMID '07 Digest, 2007, pp. 1249-1252.
Park.Sang-Hee et al., "42.3: Transparent ZnO Thin Film Transistor for the Application of High Aperture Ratio Bottom Emission AM-OLED Display", SID Digest '08: SID International Symposium Digest of Technical Papers, May 20, 2008, vol. 39, pp. 629-632.
Prins.M et al., "A Ferroelectric Transparent Thin-Film Transistor", Appl. Phys. Lett. (Applied Physics Letters), Jun. 17, 1996, vol. 68, No. 25, pp. 3650-3652.
Sakata.J et al., "Development of 4.0-In. AMOLED Display With Driver Circuit Using Amorphous In—Ga—Zn—Oxide TFTs", IDW '09: Proceedings of the 16th Internatioanl Display Workshops, 2009, pp. 689-692.
Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08: SID International Symposium Digest of Technical Papers, May 20, 2008, vol. 39, pp. 633-636.
Takahashi.M et al., "Theoretical Analysis of IGZO Transparent Amorphous Oxide Semiconductor", IDW '08: Proceedings of the 15th International Display Workshops, Dec. 3, 2008, pp. 1637-1640.
Tsuda.K et al., "Ultra Low Power Consumption Technologies for Mobile TFT-LCDs ", IDW '02: Proceedings of the 9th International Display Workshops, Dec. 4, 2002, pp. 295-298.
Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.
Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

\* cited by examiner

| Bits per Cell | 3 |
|---|---|
| Density | 18kb |
| Technology | 0.45 μm CMOS<br>0.45 μm IGZO |
| Organization | 512rows x 12columns |
| Write Performance | 100 nsec |
| Read Performance | 900 nsec |
| Power Supply | VDD/VH/VL=3/4.5/-1V |

SEMICONDUCTOR DEVICE

CROSS-REFERENCE TO RELATED APPLICATIONS

This application is a continuation of U.S. application Ser. No. 14/199,584, filed Mar. 6, 2014, now allowed, which claims the benefit of a foreign priority application filed in Japan as Serial No. 2013-052787 on Mar. 15, 2013, both of which are incorporated by reference.

BACKGROUND OF THE INVENTION

1. Field of the Invention

The present invention relates to a semiconductor device and a driving method thereof.

Note that in this specification, a semiconductor device refers to a device that includes a circuit including a semiconductor element (e.g., a transistor, a diode, a resistor, or a capacitor). Alternatively, a semiconductor device refers to any device that can function by utilizing semiconductor characteristics. For example, an integrated circuit, a chip including an integrated circuit, a display device, a light-emitting device, an electronic device, and the like are included in a semiconductor device or include a semiconductor device in some cases.

2. Description of the Related Art

A differential circuit is used for an operational amplifier, a comparator, or the like.

A comparator is one of the main circuits of an analog-digital converter (hereinafter, it may be referred to as an ADC). Variations in the electric characteristics of transistors included in a comparator generate an offset voltage at a differential circuit included in the comparator. In the case where such an offset voltage is generated, even when the same voltage is applied to two input terminals of the comparator, the comparator determines the offset voltage as a potential difference between the two input terminals; thus, the comparator outputs a signal with an unexpected output level. Thus, it is necessary to correct the offset voltage of the differential circuit to accurately perform A/D conversion.

For example, in Patent Document 1, an ADC is provided with a means for measuring the offset voltage of a comparator. Reference voltages for comparators are set based on offset voltages measured by the measurement means. Further, in Patent Document 1, data for setting these reference voltages is written to a memory circuit, and an operation of correcting an offset voltage is not performed in using the ADC.

[Patent Document 1] Japanese Published Patent Application No. 2002-319863

SUMMARY OF THE INVENTION

An object of one embodiment of the present invention is to provide a novel semiconductor device capable of correcting the offset voltage of a differential circuit. Another object of one embodiment of the present invention is to provide a semiconductor device having a function of correcting an offset voltage and a memory function of storing data for correcting the offset voltage.

Note that the descriptions of these objects do not disturb the existence of other objects. Note that one embodiment of the present invention does not necessarily achieve all the objects. Objects other than the above objects will be apparent from and can be derived from the descriptions of the specification, the drawings, the claims, and the like.

One embodiment of the present invention is a semiconductor device including a first circuit, a second circuit, and a second transistor. The first circuit includes a first input terminal, a second input terminal, and an output terminal. The first circuit is configured to output a potential corresponding to a potential difference between the first input terminal and the second input terminal. The second circuit includes a first transistor and a capacitor. The second circuit is electrically connected to the output terminal at a first node. The second circuit is configured to store a potential of the first node. The second transistor electrically connected to the output terminal at a second node. The second transistor is configured to control a potential of the second node in accordance with the stored potential in the second circuit. The first transistor includes an oxide semiconductor layer including a channel formation region.

In the following descriptions, a transistor whose channel is formed using an oxide semiconductor may be referred to as an oxide semiconductor transistor or an OS transistor.

Another embodiment of the present invention is a semiconductor device including a first circuit, a second circuit, a second transistor, a third transistor, and a fourth transistor. The first circuit includes a first input terminal, a second input terminal, and an output terminal. The first circuit is configured to output a potential corresponding to a potential difference between the first input terminal and the second input terminal. The second circuit includes a first transistor and a capacitor. The second circuit is electrically connected to the output terminal at a first node. The second circuit is configured to store a potential of the first node. The second transistor is electrically connected to the output terminal at a second node. The second transistor is configured to control a potential of the second node in accordance with the stored potential in the second circuit. The third transistor is electrically connected to the first input terminal. The fourth transistor is electrically connected to the first input terminal and the second input terminal. The ratios of a channel width W to a channel length L (W/L) of the third transistor and the fourth transistor are different from each other by two times or more.

One embodiment of the present invention enables the offset voltage of a differential circuit to be corrected with high accuracy. Further, one embodiment of the present invention makes it possible to provide a differential circuit having a function of correcting an offset voltage and a memory function of storing data for correcting the offset voltage.

DETAILED DESCRIPTION OF THE INVENTION

Figure 1A:
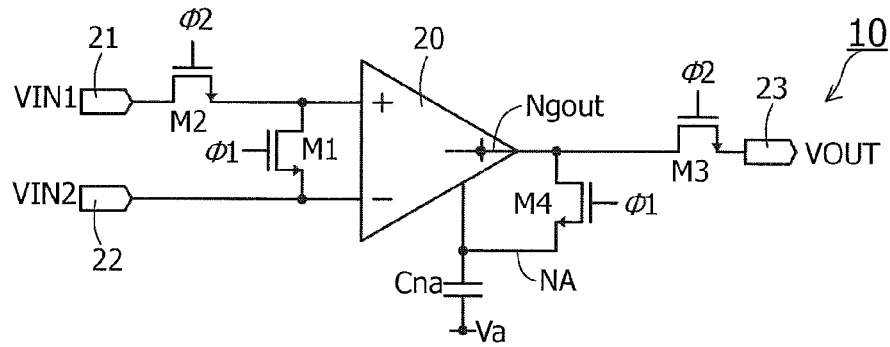
FIG. 1A is a circuit diagram illustrating a configuration example of a differential circuit.

Hereinafter, embodiments and an example will be described with reference to drawings. It will be readily appreciated by those skilled in the art that modes and details can be changed in various ways without departing from the spirit and scope of the present invention. Thus, the present invention should not be interpreted as being limited to the following descriptions of the embodiments and the example.

In the drawings used for the descriptions of the embodiments of the present invention, the same portions or portions having a similar function are denoted by the same reference numerals, and the repeated descriptions thereof are omitted.

In the drawings, a transistor is an element having three terminals (electrodes): a gate, a source, and a drain. The functions of two terminals (the source and the drain (terminals excluding the gate)) may be interchanged depending on the conductivity type (n p-type or p-type) of the transistor and potentials input to the terminals. Therefore, in this specification, in some cases, the terminals (electrodes) excluding the gate of the transistor are not referred to as a source and a drain but as a first electrode and a second electrode.

For easy understanding of circuit operations, circuit symbols with which conductivity types can be distinguished from each other and a source and a drain can be distinguished from each other are used as circuit symbols of transistors in the drawings. However, depending on potentials input to a source and a drain of a transistor, the functions of the source and the drain may be replaced with each other. Thus, a distinction between a source and a drain of a transistor in a semiconductor device of the present invention is not limited to the distinction between the source and the drain of the transistor in the drawings.

Embodiment 1

A semiconductor device of this embodiment will be described with reference to FIGS. 1A to 1E, FIG. 2, FIGS. 3A and 3B, FIG. 4, FIG. 5, FIG. 6, and FIG. 7. In this embodiment, a differential circuit having a function of correcting an offset voltage will be described as an example of a semiconductor device.

Configuration Example 1 of Differential Circuit

FIG. 1A is a circuit diagram illustrating a configuration example of a differential circuit. A circuit 10 is a differential circuit that has a function of correcting an offset voltage.

The circuit 10 includes a differential circuit 20, a pair of input terminals 21 and 22, and an output terminal 23. The input terminal 21 and the input terminal 22 function as a pair of input terminals of differential signals. A potential corresponding to a potential difference between signals input from the input terminal 21 and the input terminal 22 (VIN1−VIN2) is output as a signal VOUT from the output terminal 23. The differential circuit 20 is a circuit that generates a signal in accordance with a potential difference between signals input from a positive input terminal (+) and a negative input terminal (−). For easy understanding of the function of the differential circuit 20, the differential circuit 20 is denoted by a circuit symbol of an amplifier.

The differential circuit 20 has a function of changing the potential of a node Ngout into a potential corresponding to a potential difference (VIN1−VIN2), and outputs, as a signal, a change in the potential of the node Ngout. An error of the potential of the node Ngout due to the offset voltage of the differential circuit 20 is corrected, and the corrected potential is output as the signal VOUT (or a potential VOUT) from the output terminal 23. The circuit 10 further includes transistors M1 to M4 and a capacitor Cna as means for correcting the offset voltage of the differential circuit 20. A potential corresponding to the offset voltage is stored in a node NA by these elements. The potential of the Ngout is adjusted by the potential stored in the node NA.

In the following description, the node Ngout may be abbreviated to Ngout. Other nodes, potentials, signals, circuits, and the like may also be similarly abbreviated.

Figure 1B:
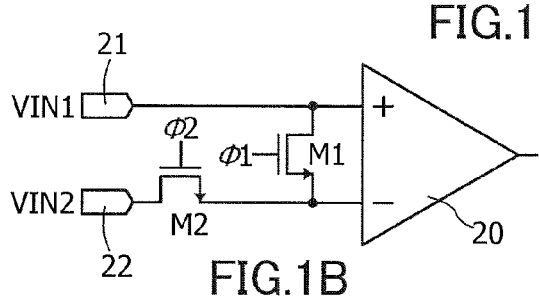
FIG. 1B is a circuit diagram illustrating a configuration example of an input portion.

The transistors M1 to M4 function as switches. The transistor M1 is a switch that connects the input terminal 21 and the input terminal 22. The transistor M2 is a switch that connects the input terminal 21 and the positive input terminal of the differential circuit 20. The transistor M2 may be provided between the input terminal 22 and the negative input terminal of the differential circuit 20 as illustrated in FIG. 1B. The circuit including the transistor M1 and the transistor M2 enables a short circuit between the two input terminals 21 and 22, separation of one of the pair of input terminals 21 and 22 from the differential circuit 20, and connection of only the other input terminal to the differential circuit 20.

The transistor M3 functions as a switch that connects the output terminal 23 and an output terminal (corresponding to a terminal connected to Ngout) of the differential circuit 20.

A sample-and-hold circuit includes the transistor M4 and the capacitor Cna. This sample-and-hold circuit has functions of determining the potential of Ngout and storing the potential in the node NA. The node NA corresponds to one terminal of the capacitor Cna. The other terminal of the capacitor Can is connected to a wiring supplied with a potential Va. The transistor M4 functions as a switch that connects Ngout and NA.

Figure 1C:
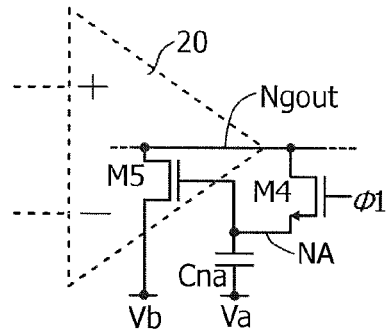
FIG. 1C is a circuit diagram illustrating a configuration example of a circuit having a function of correcting an offset voltage.

FIG. 1C illustrates a configuration example of a circuit that adjusts the potential of the node Ngout in accordance with the potential of the node NA. As illustrated in FIG. 1C, the differential circuit 20 is provided with a transistor M5 connected to the node Ngout. The transistor M5 functions as a circuit that charges or discharges the node Ngout. With the source-drain current (hereinafter referred to as a drain current) of the transistor M5, the node Ngout is charged or discharged, whereby the potential of the transistor M5 is adjusted. A gate of the transistor M5 is connected to the node NA; thus, the drain current of the transistor M5 depends on the potential of the node NA. That is, the potential of the node Ngout is adjusted in accordance with the potential of the node NA.

By setting the conductivity type of the transistor M5, the potential Vb, and the like, whether the transistor M5 charges or discharges the node Ngout can be determined. For example, in the case where the transistor M5 is an n-channel transistor and the potential Vb is maintained to be a potential lower than the potential of Ngout, such as a ground potential, the transistor M5 is turned on so that the node Ngout is discharged.

In FIG. 1C, the transistor M5 is illustrated as a circuit included in the differential circuit 20; however, the transistor M5 is not necessarily included in the differential circuit 20.

<Driving Method of Differential Circuit>

The circuit 10 can operate in two modes: a mode where a voltage for correcting the offset voltage of the differential circuit 20 is determined and a normal operation mode where a signal VOUT corresponding to a potential difference between two input signals is output. In the description below, a voltage for correcting an offset voltage may be called an "offset correction voltage" or a "correction voltage".

In the mode for offset correction voltage determination, the transistors M1 and M4 are turned on and the transistor M2 and M3 are turned off. In the normal operation mode, the transistors M1 and M4 are turned off and the transistor M2 and M3 are turned on. In the example of FIG. 1A, the transistors M1 to M4 have the same conductivity type (n-channel transistors, here), on/off of the transistors M1 and M4 is controlled by a common signal φ1, and on/off of the transistors M2 and M3 is controlled by a common signal φ2. The operations of the circuit 10 will be described below with reference to FIGS. 1D and 1E.

[Determination of Offset Correction Voltage]

Figure 1D:
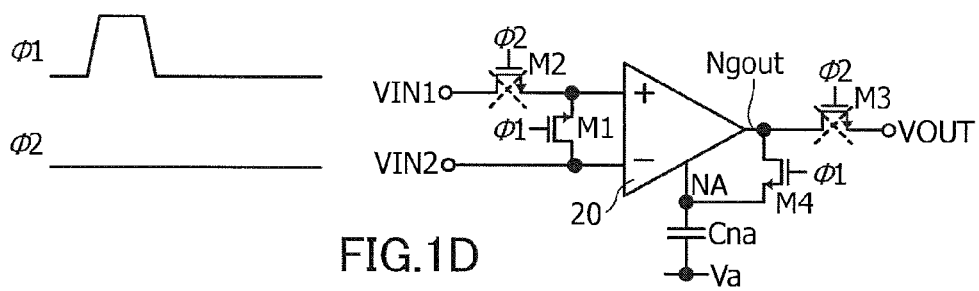
FIGS. 1D and 1E are each a timing chart and a circuit diagram showing an example of operations of a circuit in FIG. 1A.

FIG. 1D illustrates the mode for offset correction voltage determination. FIG. 1D shows waveforms of signals φ1 and φ2 and a circuit diagram illustrating operations of the circuit 10. In this mode, only the signal φ1 is set at a high level (H level), the transistors M1 and M4 are turned on, and the transistors M2 and M3 are turned off.

On the input side of the circuit 10, two input terminals of the differential circuit 20 are short-circuited and the potentials of the both input terminals become the same potential VIN2 by the operations of the transistor M1 and the transistor M2. As a result, a potential difference between the two input terminals of the differential circuit 20 becomes 0. Since the transistor M3 is off, Ngout and the output terminal 23 are out of conduction. In the state of FIG. 1D, Ngout receives negative feedback, and then, the potential of Ngout converges to a certain value. The sample-and-hold circuit (M4 and Cna) acquires and stores this potential.

In the sample-and-hold circuit (M4 and Cna), the transistor M4 is turned on, so that a sampling mode is selected. With the drain current of the transistor M4, the capacitor Cna is charged. Next, the signal φ1 is set at a low level (L level) so that the transistor M4 is turned off, to set the sample-and-hold circuit (M4 and Cna) to a holding mode. The node NA becomes in an electrically floating state and an offset correction voltage is held in the node NA. In the normal operation mode in the circuit 10, an error of the signal VOUT is corrected by utilizing the potential stored in the node NA.

[Normal Operation]

Figure 1E:
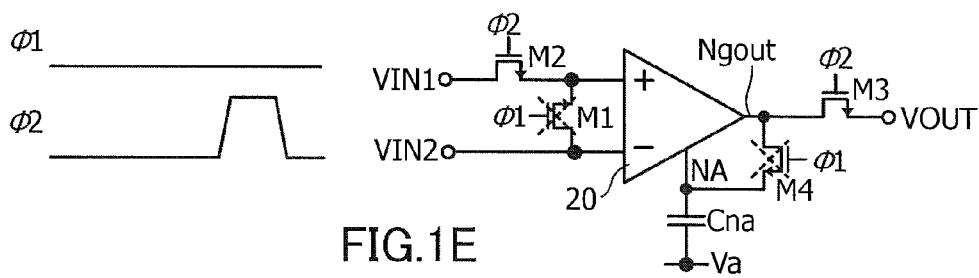

In the normal operation mode, a voltage corresponding to a potential difference between VIN1 and VIN2 is determined in the differential circuit 20, and the signal VOUT (or the potential VOUT) showing the determination result is output from the output terminal 23. FIG. 1E illustrates the normal operation mode. FIG. 1E shows waveforms of signals φ1 and φ2 and a circuit diagram illustrating operations of the circuit 10. In this mode, only the signal φ2 is set at an H level, so that the transistors M2 and M3 are turned on, and the transistors M1 and M4 are turned off.

The differential circuit 20 outputs a potential corresponding to a potential difference between VIN1 and VIN2, the potential of Ngout is corrected by the potential stored in the node NA, and thus, a potential obtained by correcting the offset voltage is output as the signal VOUT from the output terminal 23.

As illustrated in FIG. 1E, in the normal operation mode, the node NA is in an electrically floating state. A change in the potential of the node NA is minimized, whereby an offset correction voltage can be stored in the node NA for a long time. When the offset correction voltage can be stored in the node NA, it is not necessary to repeatedly perform an offset correction voltage determination operation before execution of the normal operation. This can reduce operations except the normal operation, leading to an increase in the response speed of the circuit 10 and a reduction in power consumption.

A current flowing through a leakage path of charge from the node NA is as low as possible in order that the offset correction voltage be stored in the node NA for a long time. Therefore, a transistor having a small leakage current in an off state (low off-state current) is preferably used as the transistor M4. In this specification, a "low off-state current" means that an off-state current per micrometer in channel width at room temperature is lower than or equal to 10 zA. Since the off-state current is preferably as low as possible, the normalized off-state current per micrometer in channel width is preferably lower than or equal to 1 zA, more preferably lower than or equal to 10 yA, still more preferably lower than or equal to 1 yA. Note that a voltage between a source and a drain in that case is, for example, in the range from 0.1 V to 3 V, or approximately 5 V. An example of a transistor having such a low off-state current is a transistor including an oxide semiconductor in a channel.

The use of a transistor having a low off-state current as the transistor M4 can provide the sample-and-hold circuit (M4 and Cna) with a function of a nonvolatile memory. This precludes the necessity of providing a memory that stores data for correcting the offset voltage of the differential circuit 20, outside the circuit 10. According to this embodiment, data for correcting an offset voltage (correction voltage) can be stored in the circuit without increasing the number of elements in the circuit 10, without increasing the size of the circuit 10, and without consuming excess power.

In the case of providing an OS transistor in the circuit 10, the OS transistor may include a back gate. Controlling the potential of the back gate can control the threshold voltage of the OS transistor. In the case of using an OS transistor with a back gate as the transistor M4, the potential of the back gate is controlled so that the transistor M4 is reliably off when the signal φ1 is at an L level. For example, the potential of the back gate can be set to a ground potential.

Configuration Example 2 of Differential Circuit

Figure 2:
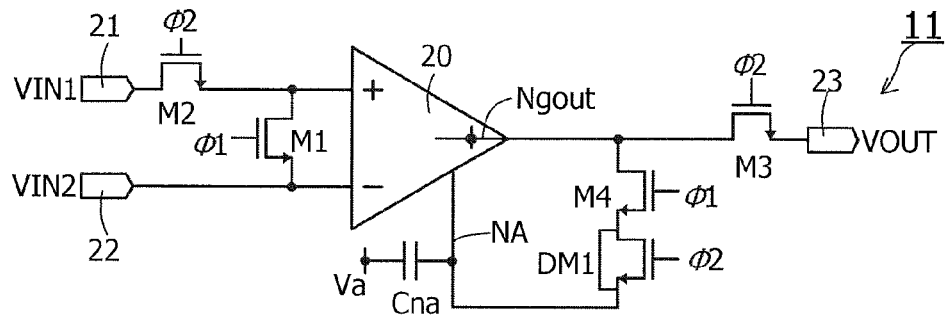
FIG. 2 is a circuit diagram illustrating a configuration example of a differential circuit including a dummy switch.

Another configuration example of a differential circuit will be described below with reference to FIG. 2. A circuit 11 in FIG. 2 is a differential circuit different from the circuit 10 in that it is provided with a dummy transistor.

A "dummy transistor" refers to a transistor where a source and a drain are short-circuited. In the circuit 11, a dummy transistor DM1 functions as a dummy switch that connects the transistor M4 and the node NA. Further, the signal φ2 is input to a gate of the dummy transistor DM1 so that a channel is formed in the normal operation mode.

The mode for offset correction voltage determination is finished by causing the signal φ1 to transition from its high state to its low state. Thus, when the transistor M4 transitions from its on state to its off state, an influence of charge injection or feed-through of the transistor M4 might change the potential of the node NA. The dummy transistor DM1 is preferably provided to compensate for a change in the potential of the node NA due to such an influence. At the time of starting the normal operation mode, the signal φ2 goes from low to high. When the level of the signal φ2 changes, the dummy transistor DM1 transitions from its off state to its on state; thus, the potential of the node NA can be increased.

When an OS transistor is used as the transistor M4, the dummy transistor DM1 is also preferably an OS transistor.

Configuration Example 3 of Differential Circuit

A more specific circuit configuration than that of the differential circuit having a function of correcting an offset voltage will be described with reference to FIGS. 3A and 3B.

As the differential circuit 20 in the circuit 10, a differential circuit including a differential pair formed of a pair of transistors can be used. FIG. 3A illustrates an example of a differential circuit including a differential pair. The circuit diagram of the circuit 30 in FIG. 3A is different from that of the circuit 10 in FIG. 1A in that the differential circuit 20 is more specifically illustrated; a differential circuit 40 corresponds to the differential circuit 20.

The differential circuit 40 includes a differential pair formed of two transistors MP1 and MP2, a current source 41, and a load circuit 42. A high power supply potential VH1 and a low power supply potential VL1 are supplied to the differential circuit 40.

Here, the transistors MP1 and MP2 serving as the differential pair are p-channel transistors. The current source 41 is connected to sources of the transistors MP1 and MP2, and the load circuit 42 is connected to drains of the transistors MP1 and MP2. As the load circuit 42, for example, a resistor, a current mirror circuit, or the like can be provided.

Figure 3A:
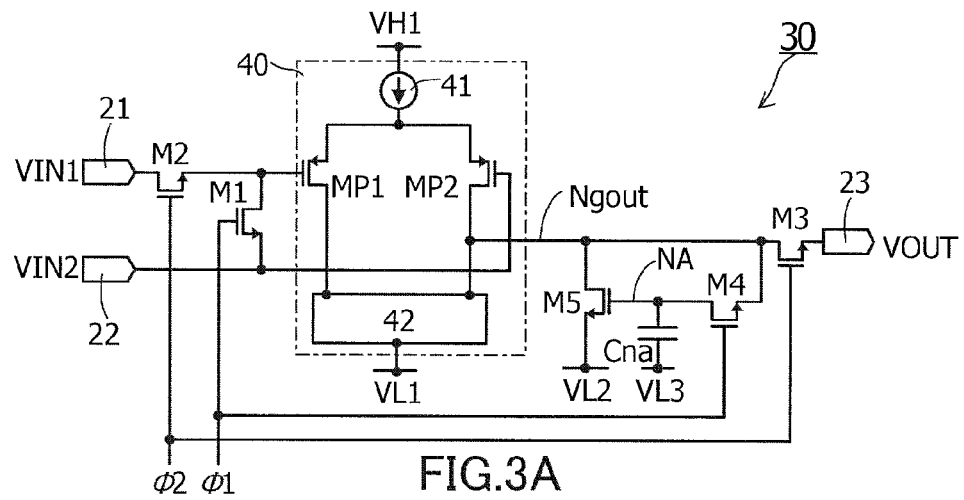
FIGS. 3A and 3B are circuit diagrams each illustrating a differential circuit having a differential pair.

In FIG. 3A, a source of the transistor M5 is connected to a wiring supplied with a low power supply potential VL2, and a terminal of the capacitor Cna is connected to a wiring supplied with a low power supply potential VL3. In the case where the low power supply potentials VL1 to VL3 can be equal to one another, a common wiring for supplying a low power supply potential can be used.

Note that the two transistors serving as the differential pair that are called differential pair transistors are generally formed to have the same size so that they have the same electric characteristics. This is for preventing generation of an offset voltage. In this embodiment, to effectively obtain the function of correcting an offset voltage, current-voltage characteristics of the differential pair transistors are deliberately made to be different from each other so that an offset voltage is generated. This enables the potential of the node NA to be a potential at which the transistor M5 is reliably turned on when the mode for offset correction voltage determination is executed.

Specifically, the ratios of the channel width W to the channel L (W/L) of the transistor MP1 and the transistor MP2 are made to be different from each other by two times or more. The W/L of the transistor MP1 and the W/L of the transistor MP2 are different from each other by, for example, two times or more and ten times or less. When the W/L of the transistor MP2 is preferably a power of 2 ($2^k$, k=1, 2, 3) of the W/L of the transistor MP1, in which case design of the circuit is facilitated. For example, the W/L of the transistor MP2 may be $2^k$ times (k=1, 2, 3) the W/L of the transistor MP1.

In the circuit 30, the dummy transistor DM1 can also be provided as in FIG. 2. FIG. 3B illustrates a configuration example of a differential circuit including a differential pair and the dummy transistor. A circuit 31 in FIG. 3B is different from the circuit 30 in that the dummy transistor DM1 is provided.

Figure 3B:
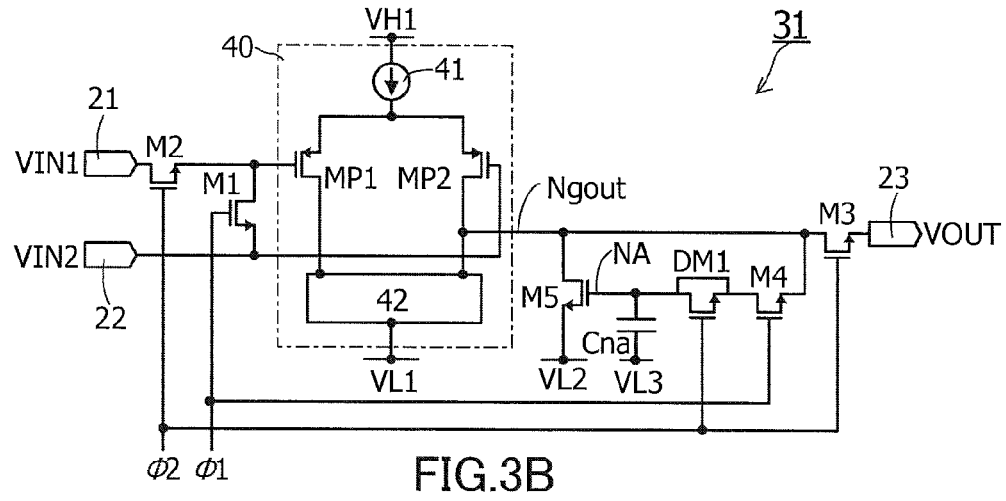

The differential pair transistors (MP1 and MP2) are p-channel transistors in FIGS. 3A and 3B but may be n-channel transistors. When the differential pair transistors (MP1 and MP2) are n-channel transistors, the power supply source 41 is provided on the low power supply potential VL1 side, and the load circuit 42 is provided on the high power supply potential VH1 side.

This embodiment can be implemented in combination with any of the other embodiments as appropriate.

Embodiment 2

In this embodiment, a comparator using the differential circuit of Embodiment 1 will be described. Note that the differential circuit of Embodiment 1 can also be used for a variety of circuits such as an operation amplifier, a sample-and-hold circuit, and a filter circuit as well as for a comparator.

FIGS. 4 to 7 are circuit diagrams illustrating configuration examples of comparators. Comparators 101 to 104 illustrated in FIGS. 4 to 7 each have a function of determining whether the potential VIN is higher than or lower than a reference potential VREF. When YIN is higher than VREF, an H-level signal VOUT is output from the output terminal 23. When VIN is lower than VREF, an L-level signal VOUT is output from the output terminal 23.

Configuration Example 1 of Comparator

Figure 4:
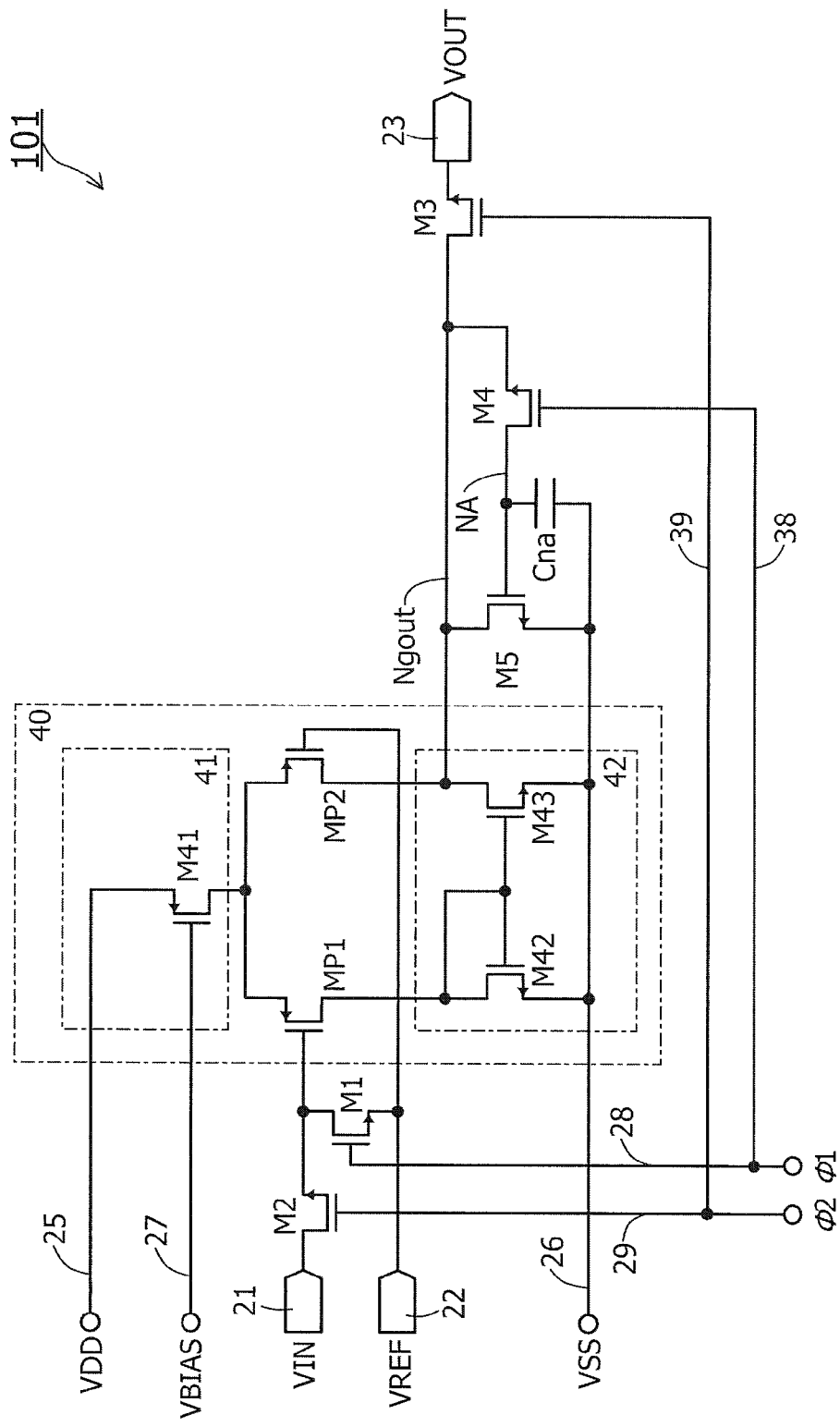
FIG. 4 is a circuit diagram illustrating a configuration example of a comparator.

As illustrated in FIG. 4, the comparator 101 includes the differential circuit 40, the transistors M1 to M5, and the capacitor Cna.

The comparator 101 is supplied with a high power supply potential VDD through a wiring 25 and supplied with a low power supply potential VSS through a wiring 26. VSS can be a ground potential. The reference potential VREF is input to the input terminal 22, and the potential VIN (or the signal VIN), which is to be compared with VREF, is input to the input terminal 21. Thus, in the mode for offset correction voltage determination, VREF is input to two terminals (a gate of MP1 and a gate of MP2) of the differential circuit 40. The signal φ1 is input to a gate of the transistor M1 through a wiring 28. The signal φ2 is input to a gate of the transistor M2 through a wiring 29. The signal φ2 is input to a gate of the transistor M3 through a wiring 39. The signal φ1 is input to a gate of the transistor M4 through a wiring 38.

In the differential circuit 40, a transistor M41 functions as the current source 41. The transistor M41 is a p-channel transistor; a gate of the transistor M41 is connected to a wiring 27 supplied with a potential VBIAS, a source of the transistor M41 is connected to the wiring 25, and a drain of the transistor M41 is connected to the differential pair (MP1 and MP2).

A transistor M42 and a transistor M43 form a current mirror circuit functioning as the load circuit 42. Here, the transistors M42 and M43 are n-channel transistors.

The transistor MP1 and the transistor MP2 form the differential pair. Here, the W/L of the transistor MP2 is twice or more that of the transistor MP1. This is because the transistor M5 functions as a circuit that discharges the node Ngout (a circuit that decreases the potential of the node Ngout) and does not have a function of increasing the potential of the node Ngout. Thus, in the mode for offset correction voltage determination, the W/L of the transistor MP2 is set to higher than the that of the transistor MP1 to increase, in advance, the potential of the node Ngout by a voltage reduced because of discharge in the normal operation mode.

Configuration Examples 2, 3 of Comparators

An amplifier circuit can be provided at an output stage of a comparator. The amplifier circuit should be a circuit having a function of amplifying an output (the potential of Ngout) of the differential circuit 40. Examples of the amplifier circuit include a source follower circuit and a common source amplifier circuit. The amplifier circuit is provided between Ngout and the transistor M3. An input terminal of the amplifier circuit is connected to Ngout, and an output terminal of the amplifier circuit is connected to the output terminal 23 through the transistor M3.

Figure 5:
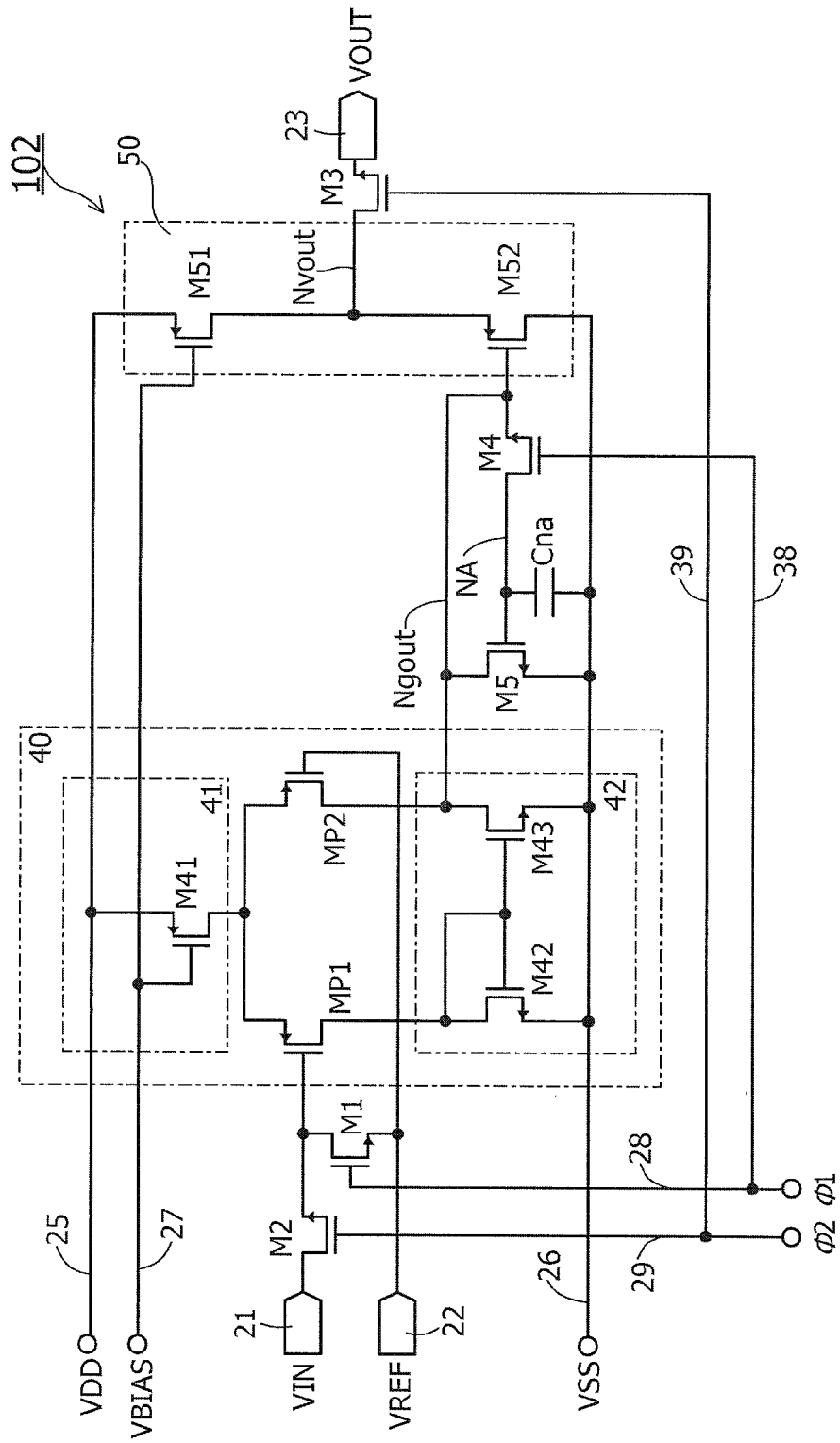
FIG. 5 is a circuit diagram illustrating a configuration example of a comparator provided with an amplifier circuit at an output stage.

FIG. 5 illustrates a configuration example of a comparator including a source follower circuit. A source follower circuit 50 is provided at an output stage of a comparator 102. The source follower circuit 50 includes a transistor M51 and a transistor M52 connected in series. A gate of the transistor M51 is connected to the wiring 27, a source of the transistor M51 is connected to the wiring 25, and a drain of the transistor M51 is connected to a source of the transistor M52. A gate of the transistor M52 is connected to the node Ngout, the source of the transistor M52 is connected to the drain of the transistor M51, and a drain of the transistor M52 is connected to the wiring 26.

The source follower circuit 50 can increase an output potential (the potential of the node Ngout) so that it becomes higher than an input potential by a gate-source voltage (|Vgs|) of the transistor M52. Thus, when the potential of the node Ngout is Vgout, the potential of the node NVOUT is Vgout+|Vgs|.

Figure 6:
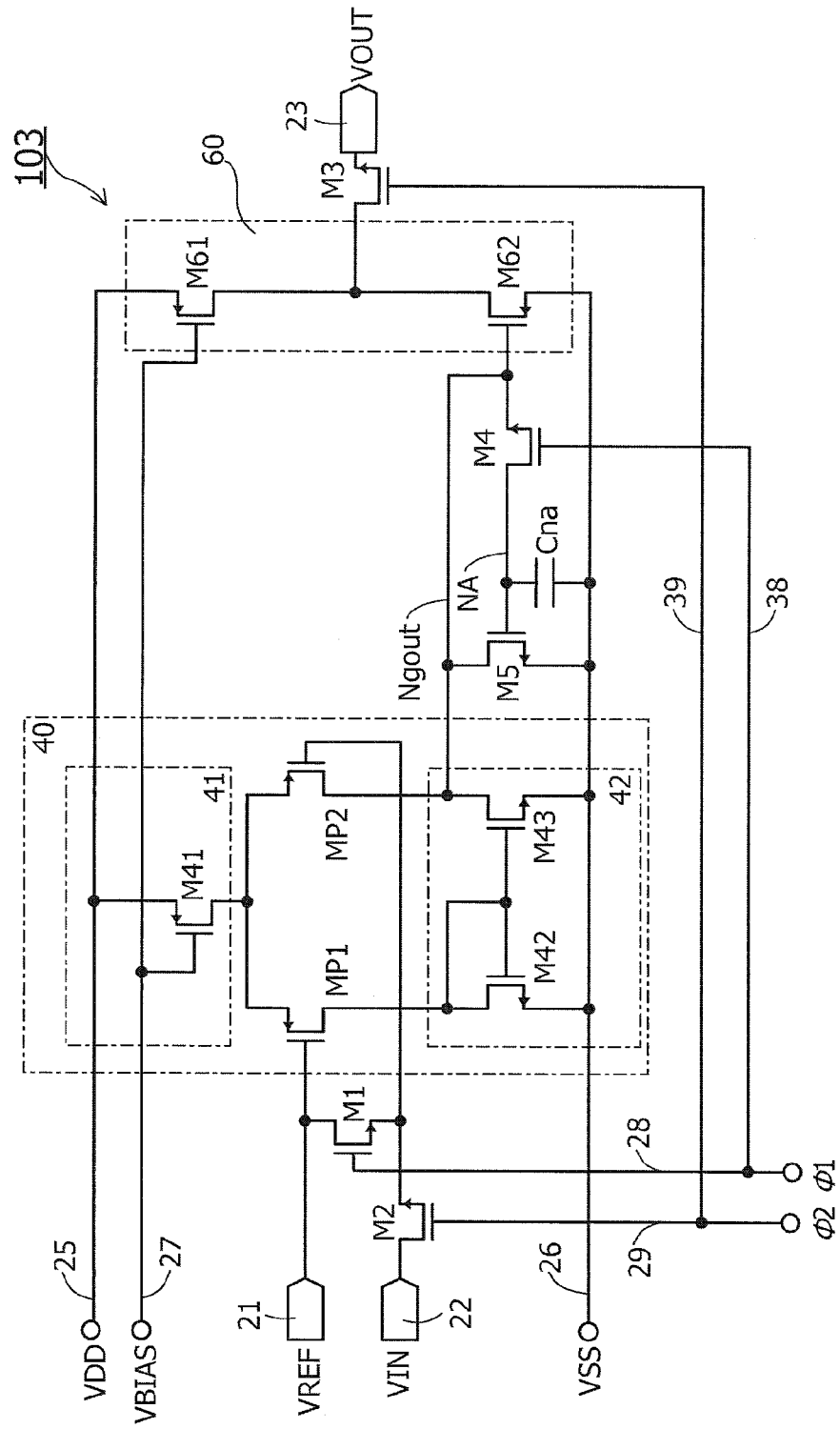
FIG. 6 is a circuit diagram illustrating a configuration example of a comparator provided with an amplifier circuit at an output stage.

FIG. 6 illustrates a configuration example of a comparator including a common source amplifier circuit. A common source amplifier circuit 60 is provided at an output stage of a comparator 103. The common source amplifier circuit 60 includes a transistor M61 and a transistor M62 connected in series. A gate of the transistor M61 is connected to the wiring 27, a source of the transistor M61 is connected to the wiring 25, and a drain of the transistor M61 is connected to a drain of the transistor M62. A gate of the transistor M62 is connected to the node Ngout, a source of the transistor M62 is connected to the wiring 26, and the drain of the transistor M62 is connected to the drain of the transistor M61.

The common source amplifier circuit 60 inverts an input logical value and outputs the inverted logical value; thus, in the comparator 103, the reference potential VREF is input to the input terminal 21 and VIN is input to the input terminal 22. The transistor M2 is provided on the input terminal 22 side.

Configuration Example 4 of Comparator

Figure 7:
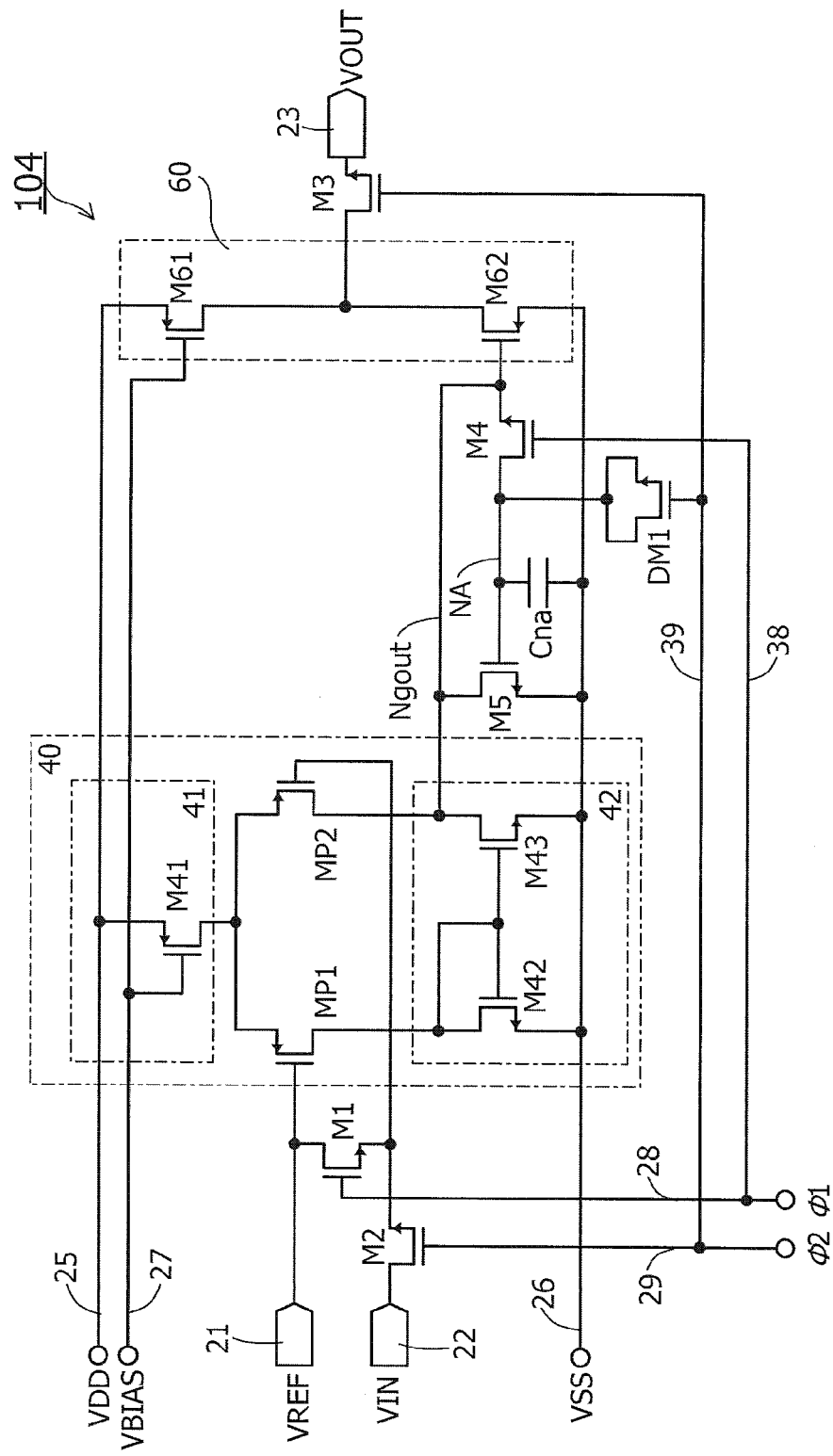
FIG. 7 is a circuit diagram illustrating a configuration example of a comparator including a dummy switch.

As in the circuit 11 of FIG. 2, a dummy transistor can be provided in a comparator. FIG. 7 illustrates a configuration example of a comparator including a dummy transistor. A comparator 104 in FIG. 7 is different from the comparator 103 in FIG. 6 in that the dummy transistor DM1 is provided. The signal φ2 is input to a gate of the dummy transistor DM1 through the wiring 39. Each of the comparators 101 and 102 may also be provided with the dummy transistor DM1.

The use of the comparator of this embodiment allows fabrication of an analog-digital converter circuit (ADC). A configuration example of an ADC will be described with reference to FIG. 8 and FIG. 9. Here, a configuration example of a flash ADC will be described.

Configuration Example 1 of ADC

Figure 8:
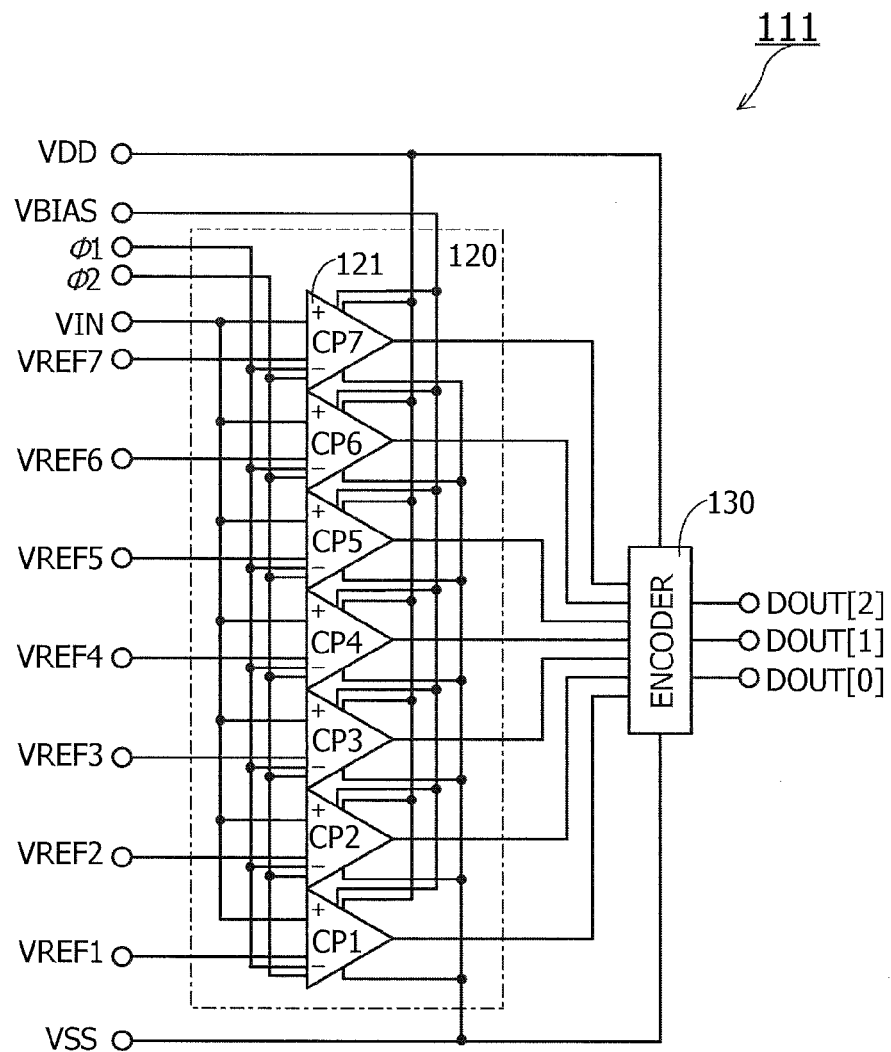
FIG. 8 is a circuit diagram illustrating a configuration example of an analog-digital converter (ADC) including a comparator.

As illustrated in FIG. 8, an ADC 111 includes a comparator array 120 and an encoder 130. In the comparator array 120, a plurality of stages of comparators 121 are arranged in parallel. As the comparator 121, any of the comparators 101 to 104 can be used. Different reference potentials are input to inverting input terminals (−) of the comparators 121, and the potential VIN is input to non-inverting input terminals (+) of the comparators 121. The signals φ1 and φ2 are input to the comparators 121.

In the example of FIG. 8, the ADC 111 is a 3-bit ADC, and the comparator array 120 is provided with seven ($=2^3-1$) stages of comparators 121. In the case where seven comparators in the comparator array 120 are distinguished from one another in the following description, the seven comparators are called CP1 to CP7.

Reference potentials VREF1 to VREF7 are input to the inverting input terminals (−) of CP1 to CP7. Outputs of CP1 to CP7 are input to the encoder 130. The encoder 130 generates a signal DOUT [2:0] corresponding to a 3-bit digital code from the potential levels of the outputs of CP1 to CP7 and outputs the signal. DOUT[0] denotes the first ($2^0$-th) bit digital code.

Configuration Example 2 of ADC

Figure 9:
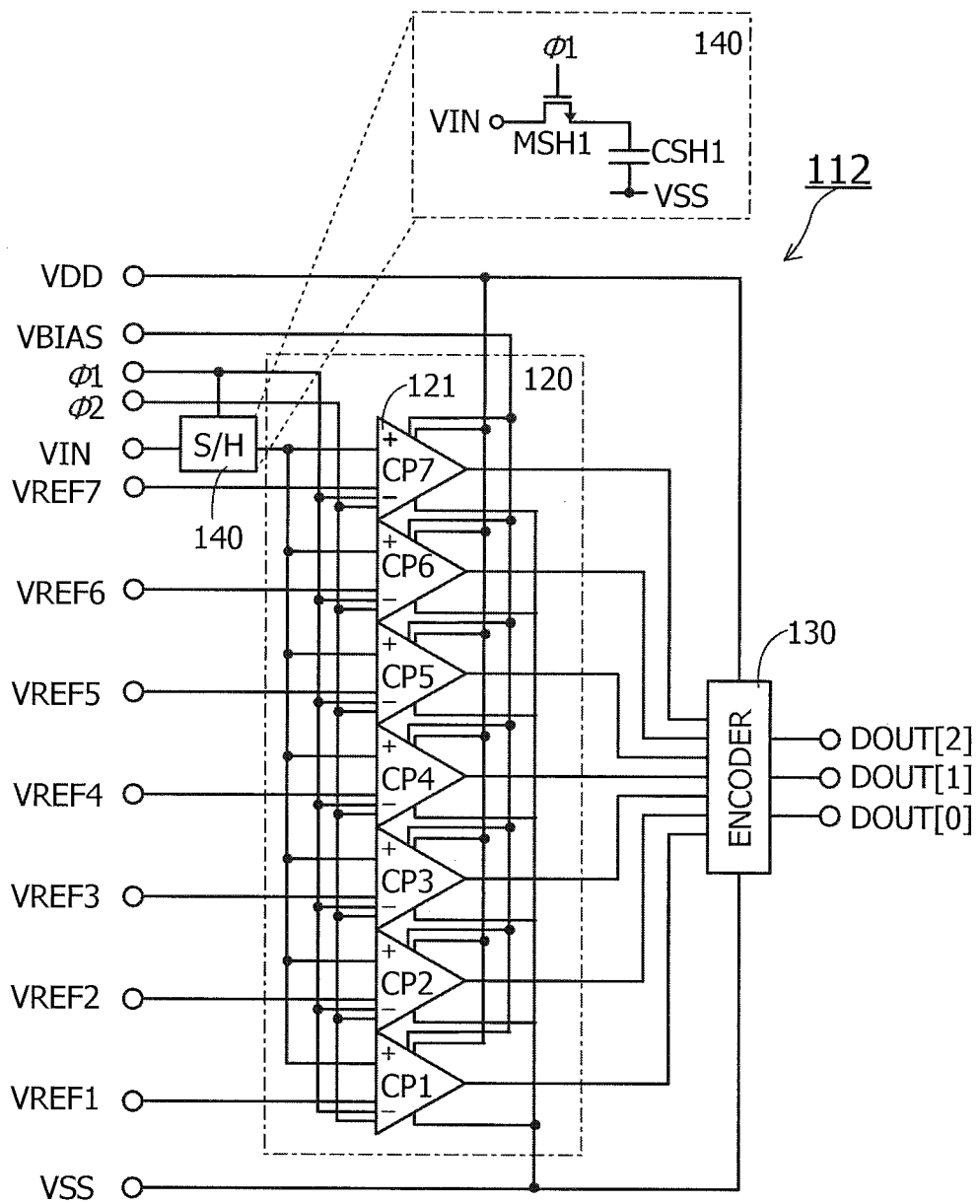
FIG. 9 is a circuit diagram illustrating a configuration example of an ADC including a comparator.

As illustrated in FIG. 9, an ADC 112 is different from the ADC 111 in that a sample-and-hold circuit 140 (S/H) is provided. The sample-and-hold circuit 140 includes a transistor MSH1 and a capacitor CSH1. The sample-and-hold circuit 140 has a function of holding a potential corresponding to the potential VIN in the capacitor CSH1.

On/off of the transistor MSH1 is controlled by the signal φ1. The use of a transistor having the same conductivity type as that of the transistor M4 (here, an n-channel transistor) as the transistor MSH1 enables a sampling operation and a holding operation of the sample-and-hold circuit 140 to be performed at the same timing as that of a sampling operation and a holding operation of the sample-and-hold circuit (M4 and Cna) provided in the comparator 121. Thus, while an offset correction voltage in the comparator 121 is determined, the potential VIN can be sampled in the sample-and-hold circuit 140.

Note that on/off of the transistor MSH1 may be controlled by a signal different from the signals φ1 and φ2.

When an OS transistor having an extremely low off-state current is also used as the transistor MSH1 as in the case of the transistor M4, the sample-and-hold circuit 140 can have a function of a nonvolatile memory. Accordingly, the potential sampled in the sample-and-hold circuit 140 can be held for a long period.

The ADC described in this embodiment can be incorporated in any of various semiconductor devices, as a device that converts an analog signal into a digital code. For example, the ADC of this embodiment can be used as an ADC of any of semiconductor devices such as a communication IC, a storage device capable of storing multilevel data, and a CMOS image sensor.

Embodiment 3

The differential circuit of Embodiment 1 and the comparator of Embodiment 2 can be incorporated in one IC chip together with other circuits. In this embodiment, a die of an IC chip included in a semiconductor device that includes a comparator will be described.

Figure 10:
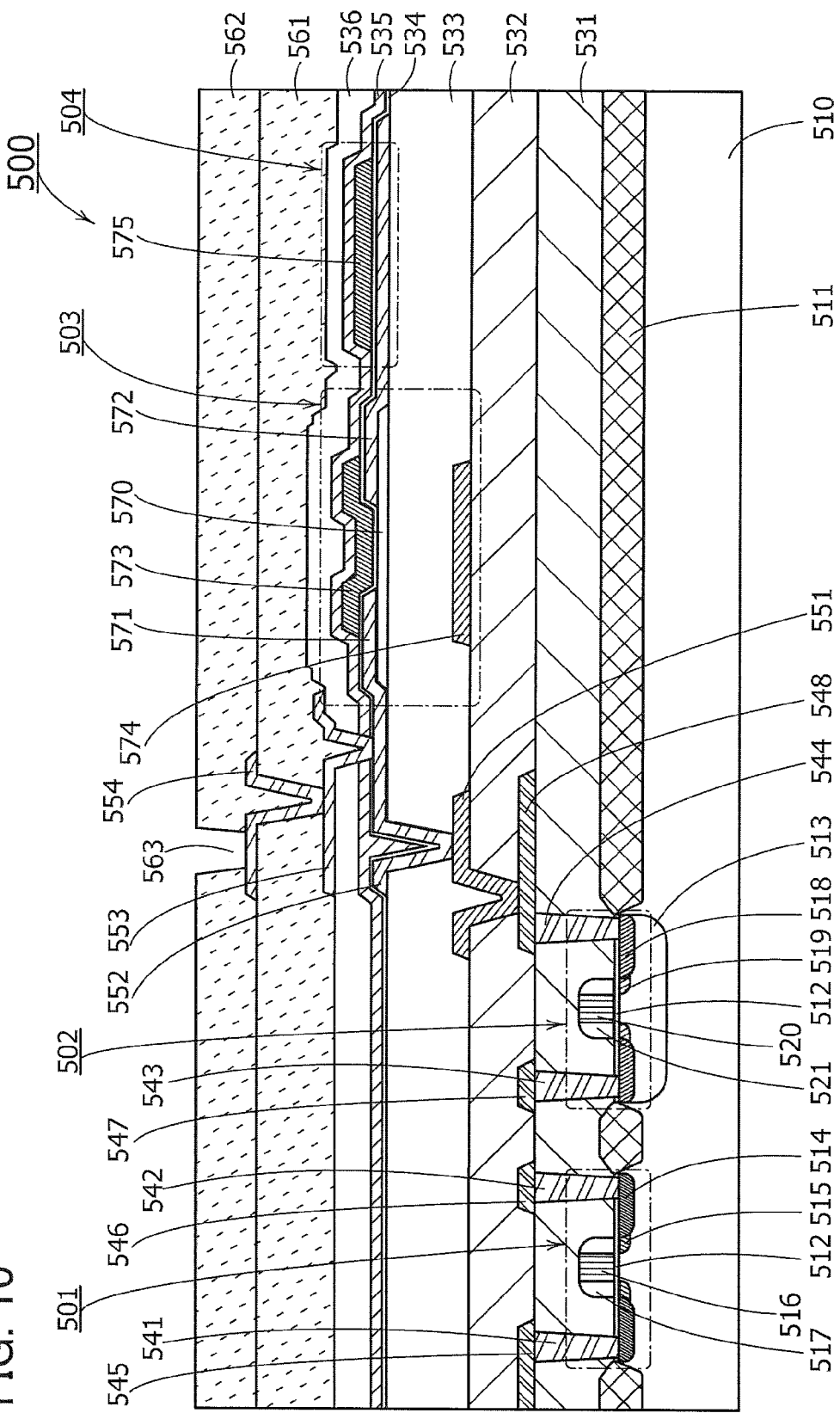
FIG. 10 is a cross-sectional view illustrating a structural example of a die of an IC chip including a comparator.

FIG. 10 illustrates a partial cross-sectional structure of a die 500 as an example. In FIG. 10, transistors 501 to 503 and a capacitor 504 are illustrated as elements included in the semiconductor device. Note that FIG. 10 is not a cross-sectional view of the die 500 taken along a specific line but a view for illustrating a layered structure of the die 500.

The use of an IC chip formed using the die 500 as an electronic component enables fabrication of a variety of electronic devices.

The transistors 501 and 502 in the die 500 are transistors whose channels are each formed in a single crystal silicon wafer 510, and thus the transistors 501 and 502 are called Si transistors 501 and 502. The Si transistor 501 is a p-channel transistor, and the Si transistor 502 is an re-channel transistor. The transistor 503 is an OS transistor whose channel includes an oxide semiconductor and thus the transistor 503 is called an OS transistor 503.

In the comparators 101 to 104, the OS transistor 503 corresponds to the transistor M4, and the capacitor 504 corresponds to the capacitor Cna. The Si transistor 501 corresponds to, for example, the transistor MP2 included in a differential pair. The Si transistor 502 corresponds to, for example, the transistor (M42 or M43) included in a current mirror circuit or the transistor (M1, M2, M3, or M5) included in a switch.

Stacking the OS transistor 503 and the capacitor 504 over semiconductor elements formed using the single crystal silicon wafer 510, such as the Si transistor 501 and 502, as illustrated in FIG. 10 can reduce the size of the die 500. The number of OS transistors is smaller than that of Si transistors in the die 500; thus, the size of the OS transistor 503 can be larger than that of the Si transistors 501 and 502.

In the example of FIG. 10, the single crystal silicon wafer 510 is an n-type single crystal silicon wafer. Examples of other semiconductor substrates are an n-type and p-type SOI substrates and compound semiconductor substrates (a GaAs substrate, an InP substrate, a GaN substrate, a SiC substrate, and a ZnSe substrate).

The Si transistors 501 and 502 are electrically isolated from each other by an element isolation insulating film 511.

The element isolation insulating film 511 can be formed by a selective oxidation method such as a local oxidation of silicon (LOCOS) method, a trench isolation method, or the like. Note that an SOI semiconductor substrate may be used instead of the single crystal silicon wafer 510. In this case, element isolation is performed by dividing a semiconductor layer into elements by etching.

An insulating film 512 is formed on regions of the single crystal silicon wafer 510 where the Si transistor 501 and 502 are formed, by oxidation treatment and/or nitridation treatment. The insulating film 512 serves as gate insulating films of the Si transistors 501 and 502. In the region where the Si transistor 502 is formed, a p-well 513 is formed by selective addition of an impurity element imparting p-type conductivity.

The Si transistor 501 includes a p-type impurity region 514, a p-type low concentration impurity region 515, and a gate electrode 516. The Si transistor 502 includes an n-type impurity region 518, an n-type low concentration impurity region 519, and a gate electrode 520. The gate electrode 516 and the gate electrode 520 are provided with a sidewalls 517 and side walls 521, respectively.

An insulating film 531 is formed over the Si transistors 501 and 502. Contact holes are formed in the insulating film 531 and the insulating film 512 so as to reach the p-type impurity region 514 and the n-type impurity region 518. In the contact holes, electrodes 541 and 542 are formed in contact with the p-type impurity region 514 and electrodes 543 and 544 are formed in contact with the n-type impurity region 518. Wirings 545 to 548 are formed over the insulating film 531 so as to be in contact with the electrodes 541 to 544.

Examples of conductive materials for forming the gate electrodes 516 and 520, the electrodes 541 to 544, and the wirings 545 to 548 are metals such as aluminum, chromium, copper, silver, gold, platinum, tantalum, nickel, titanium, molybdenum, tungsten, hafnium (Hf), vanadium (V), niobium (Nb), manganese, magnesium, zirconium, and beryllium, an alloy containing any of these metal elements as a component, and a compound containing any of these metal elements as a component. The gate electrode 516 and 520 may be formed using a semiconductor typified by polycrystalline silicon containing an impurity element such as phosphorus, or silicide such as nickel silicide.

An insulating film 532 and an insulating film 533 are formed over the insulating film 531, and the OS transistor 503 and the capacitor 504 are formed over the insulating film 533.

The OS transistor 503 includes an oxide semiconductor layer 570, an insulating film 534, and conductive films 571 to 574. The insulating film 534 serves as a gate insulating film of the OS transistor 503. The conductive films 571 and 572 serve as source and drain electrodes. The conductive film 573 serves as a gate electrode. The conductive film 574 serves as a back gate electrode. Note that the conductive film 574 is provided in the OS transistor 503 as needed.

The OS transistor 503 is connected to the Si transistor 502 through the conductive film 551 formed over the insulating film 532.

In the capacitor 504, the insulating film 534 serves as a dielectric and the conductive film 572 and the conductive film 575 serve as a pair of terminals (electrodes).

The OS transistor 503 and the capacitor 504 are covered with an insulating film 535 and an insulating film 536. The insulating film 535 is preferably an insulating film that can prevent hydrogen released from the insulating film 536 from entering the oxide semiconductor layer 570. Examples of such an insulating film include a silicon nitride film.

The insulating films 531 to 536 can be formed with a single layer of insulating film or a multilayer of two or more insulating films. Examples of the insulating film used for the insulating films 531 to 536 include an aluminum oxide film, a magnesium oxide film, a silicon oxide film, a silicon oxynitride film, a silicon nitride oxide film, a silicon nitride film, a gallium oxide film, a germanium oxide film, a yttrium oxide film, a zirconium oxide film, a lanthanum oxide film, a neodymium oxide film, a hafnium oxide film, and a tantalum oxide film. These insulating films can be formed by a sputtering method, a CVD method, an MBE method, an ALD method, or a PLD method.

Note that in this specification, an oxynitride refers to a substance that contains more oxygen than nitrogen, and a nitride oxide refers to a substance that contains more nitrogen than oxygen.

A conductive film 553 is formed over the insulating film 536 so as to be in contact with a conductive film 552. An insulating film 561 serving as a planarization film is formed to cover the insulating film 536. A conductive film 554 is formed over the insulating film 561. The conductive film 554 is provided in contact with the conductive film 553 and serves as an extraction electrode or a lead wiring. An insulating film 562 is formed over the insulating film 561. A contact hole 563 is formed in the insulating film 562 so as to reach the conductive film 554.

The insulating film 561 and the insulating film 562 can also be formed in a manner similar to that of the insulating films 531 to 536 but are preferably formed using a resin film such as a polyimide film or an acrylic film so that they can serve as planarization films. The conductive films 551 to 554 and the conductive films 571 to 575 can also be formed in a manner similar to that of the wiring 545.

The thickness of the oxide semiconductor layer 570 is preferably greater than or equal to 2 nm and less than or equal to 40 nm. The oxide semiconductor layer 570 where a channel formation region of the OS transistor 503 is formed is preferably an i-type (intrinsic) or substantially i-type oxide semiconductor. Note that an oxide semiconductor layer containing reduced amount of impurities serving as electron donors (donors), such as moisture and hydrogen, and including reduced oxygen vacancies is an i-type (intrinsic) or substantially i-type semiconductor. Here, such an oxide semiconductor layer is referred to as a highly-purified oxide semiconductor layer. A transistor formed using a highly-purified oxide semiconductor layer has an extremely low low off-state current and high reliability.

For fabrication of a transistor with a low off-state current, the carrier density of the oxide semiconductor layer 570 is preferably lower than or equal to $1\times10^{17}/cm^3$, more preferably lower than or equal to $1\times10^{16}/cm^3$, lower than or equal to $1\times10^{15}/cm^3$, lower than or equal to $1\times10^{14}/cm^3$, or lower than or equal to $1\times10^{13}/cm^3$.

The use of the oxide semiconductor layer 570 enables the source-drain current of the OS transistor 503 in an off state to be $1\times10^{-18}$ A or lower at room temperature (approximately 25° C.). The off-state source-drain current at room temperature (approximately 25° C.) is preferably $1\times10^{-21}$ A or lower, more preferably $1\times10^{-24}$ A or lower. Alternatively, at 85° C., the off-state current value can be $1\times10^{-15}$ A or lower, preferably, $1\times10^{-18}$ A or lower, more preferably $1\times10^{-21}$ A or lower. Note that an off state of an n-channel transistor refers to a state where the gate voltage is sufficiently lower than the threshold voltage. Specifically, the transistor is in an off state when the gate voltage is lower than the threshold voltage by 1 V or more, 2 V or more, or 3 V or more.

Some experiments prove that the off-state current of a transistor whose channel is formed using an oxide semiconductor is extremely low. For example, the following measurement data was obtained: a transistor with a channel width of $1\times10^6$ μm and a channel length of 10 μm can have an off-state current less than or equal to the measurement limit of a semiconductor parameter analyzer, that is, less than or equal to $1\times10^{-13}$ A when the source-drain voltage (drain voltage) ranges from 1 V to 10 V. In that case, the off-state current standardized on the channel width of the transistor is 100 zA/μm or lower.

In another experiment, off-state current is measured with a circuit in which a capacitor and a transistor are connected to each other and charge flowing to or from the capacitor is controlled by an OS transistor. In this case, the off-state current of the OS transistor is measured from a change in the amount of charge of the capacitor per unit time. The result shows that when the drain voltage is 3 V, the off-state current of the OS transistor is several tens of yoctoamperes per micrometer (yA/μm). Thus, the off-state current of a transistor in which a highly-purified oxide semiconductor layer is used for a channel formation region is considerably lower than that of a Si transistor having crystallinity.

The oxide semiconductor layer 570 is preferably formed using an oxide containing at least one element selected from In, Ga, Sn, and Zn. As such an oxide, an In—Sn—Ga—Zn oxide, an In—Ga—Zn oxide, an In—Sn—Zn oxide, an In—Al—Zn oxide, a Sn—Ga—Zn oxide, an Al—Ga—Zn oxide, a Sn—Al—Zn oxide, an In—Zn oxide, a Sn—Zn oxide, an Al—Zn oxide, a Zn—Mg oxide, a Sn—Mg oxide, an In—Mg oxide, an In—Ga oxide, an In oxide, a Sn oxide, a Zn oxide, or the like can be used. Further, any of the above oxides may contain an element other than In, Ga, Sn, and Zn, for example, $SiO_2$.

Note that, for example, an In—Ga—Zn oxide means an oxide containing In, Ga, and Zn and there is no particular limitation on the atomic ratio of In, Ga, Zn, and O.

Typical crystal structures of the oxide semiconductor layer 570 are a single crystal structure, a microcrystalline structure, a polycrystalline structure, and an amorphous structure. The oxide semiconductor layer 570 is preferably a CAAC-OS (c-axis aligned crystalline oxide semiconductor) film. The oxide semiconductor layer 570 may be formed with a single layer of oxide film or a multilayer of two or more oxide semiconductor films.

A structure of an oxide semiconductor film forming the oxide semiconductor layer 570 will be described below.

An oxide semiconductor film is classified roughly into a single-crystal oxide semiconductor film and a non-single-crystal oxide semiconductor film. The non-single-crystal oxide semiconductor film includes any of an amorphous oxide semiconductor film, a microcrystalline oxide semiconductor film, a polycrystalline oxide semiconductor film, a c-axis aligned crystalline oxide semiconductor (CAAC-OS) film, and the like. The non-single-crystal oxide semiconductor film includes any of an amorphous oxide semiconductor film, a microcrystalline oxide semiconductor film, a polycrystalline oxide semiconductor film, a c-axis aligned crystalline oxide semiconductor (CAAC-OS) film, and the like.

The amorphous oxide semiconductor film has disordered atomic arrangement and no crystalline component. A typical example thereof is an oxide semiconductor film in which no crystal part exists even in a microscopic region, and the whole of the film is amorphous.

The microcrystalline oxide semiconductor film includes a microcrystal (also referred to as nanocrystal) with a size greater than or equal to 1 nm and less than 10 nm, for example.

Thus, the microcrystalline oxide semiconductor film has a higher degree of atomic order than the amorphous oxide semiconductor film. Hence, the density of defect states of the microcrystalline oxide semiconductor film is lower than that of the amorphous oxide semiconductor film.

The CAAC-OS film is one of oxide semiconductor films including a plurality of crystal parts, and most of the crystal parts each fit inside a cube whose one side is less than 100 nm. Thus, there is a case where a crystal part included in the CAAC-OS film fits inside a cube whose one side is less than 10 nm, less than 5 nm, or less than 3 nm. The density of defect states of the CAAC-OS film is lower than that of the microcrystalline oxide semiconductor film. The CAAC-OS film is described in detail below.

In a transmission electron microscope (TEM) image of the CAAC-OS film, a boundary between crystal parts, that is, a grain boundary is not clearly observed. Thus, in the CAAC-OS film, a reduction in electron mobility due to the grain boundary is less likely to occur.

According to the TEM image of the CAAC-OS film observed in a direction substantially parallel to a sample surface (cross-sectional TEM image), metal atoms are arranged in a layered manner in the crystal parts. Each metal atom layer has a morphology reflected by a surface over which the CAAC-OS film is formed (hereinafter, a surface over which the CAAC-OS film is formed is referred to as a formation surface) or a top surface of the CAAC-OS film, and is arranged in parallel to the formation surface or the top surface of the CAAC-OS film.

On the other hand, according to the TEM image of the CAAC-OS film observed in a direction substantially perpendicular to the sample surface (plan TEM image), metal atoms are arranged in a triangular or hexagonal arrangement in the crystal parts. However, there is no regularity of arrangement of metal atoms between different crystal parts.

From the results of the cross-sectional TEM image and the plan TEM image, alignment is found in the crystal parts in the CAAC-OS film.

A CAAC-OS film is subjected to structural analysis with an X-ray diffraction (XRD) apparatus. For example, when the CAAC-OS film including an InGaZnO$_4$ crystal is analyzed by an out-of-plane method, a peak appears frequently when the diffraction angle (2θ) is around 31°. This peak is derived from the (009) plane of the InGaZnO$_4$ crystal, which indicates that crystals in the CAAC-OS film have c-axis alignment, and that the c-axes are aligned in a direction substantially perpendicular to the formation surface or the top surface of the CAAC-OS film.

On the other hand, when the CAAC-OS film is analyzed by an in-plane method in which an X-ray enters a sample in a direction substantially perpendicular to the c-axis, a peak appears frequently when 2θ is around 56°. This peak is derived from the (110) plane of the InGaZnO$_4$ crystal. Here, analysis (φ scan) is performed under conditions where the sample is rotated around a normal vector of a sample surface as an axis (φ axis) with 2θ fixed at around 56°. In the case where the sample is a single-crystal oxide semiconductor film of InGaZnO$_4$, six peaks appear. The six peaks are derived from crystal planes equivalent to the (110) plane. On the other hand, in the case of a CAAC-OS film, a peak is not clearly observed even when φ scan is performed with 2θ fixed at around 56°.

According to the above results, in the CAAC-OS film having c-axis alignment, while the directions of a-axes and b-axes are different between crystal parts, the c-axes are aligned in a direction parallel to a normal vector of a formation surface or a normal vector of a top surface. Thus, each metal atom layer arranged in a layered manner observed in the cross-sectional TEM image corresponds to a plane parallel to the a-b plane of the crystal.

Note that the crystal part is formed concurrently with deposition of the CAAC-OS film or is formed through crystallization treatment such as heat treatment. As described above, the c-axis of the crystal is aligned in a direction parallel to a normal vector of a formation surface or a normal vector of a top surface. Thus, for example, in the case where a shape of the CAAC-OS film is changed by etching or the like, the c-axis might not be necessarily parallel to a normal vector of a formation surface or a normal vector of a top surface of the CAAC-OS film.

In this specification, a term "parallel" indicates that the angle formed between two straight lines is greater than or equal to −10° and less than or equal to 10°, and accordingly also includes the case where the angle is greater than or equal to −5° and less than or equal to 5°. In addition, a term "perpendicular" indicates that the angle formed between two straight lines is greater than or equal to 80° and less than or equal to 100°, and accordingly includes the case where the angle is greater than or equal to 85° and less than or equal to 95°.

Further, the degree of crystallinity in the CAAC-OS film is not necessarily uniform. For example, in the case where crystal growth leading to the CAAC-OS film occurs from the vicinity of the top surface of the film, the degree of the crystallinity in the vicinity of the top surface is higher than that in the vicinity of the formation surface in some cases. Further, when an impurity is added to the CAAC-OS film, the crystallinity in a region to which the impurity is added is changed, and the degree of crystallinity in the CAAC-OS film varies depending on regions.

Note that when the CAAC-OS film with an InGaZnO$_4$ crystal is analyzed by an out-of-plane method, a peak of 2θ may also be observed at around 36°, in addition to the peak of 2θ at around 31°. The peak of 2θ at around 36° indicates that a crystal having no c-axis alignment is included in part of the CAAC-OS film. It is preferable that in the CAAC-OS film, a peak of 2θ appear at around 31° and a peak of 2θ do not appear at around 36°.

In a transistor using the CAAC-OS film, change in electric characteristics due to irradiation with visible light or ultraviolet light is small. Thus, the transistor has high reliability. Note that an oxide semiconductor film may be a stacked film including two or more films of an amorphous oxide semiconductor film, a microcrystalline oxide semiconductor film, and a CAAC-OS film, for example.

A formation method of the CAAC-OS film will be described below. A CAAC-OS film is formed by, for example, a sputtering method using a polycrystalline oxide semiconductor sputtering target.

For example, a CAAC-OS film is deposited by a sputtering method using a polycrystalline oxide semiconductor sputtering target. When ions collide with the sputtering target, a crystal region included in the sputtering target may be separated from the target along an a-b plane; in other words, a sputtered particle having a plane parallel to an a-b plane (flat-plate-like sputtered particle or pellet-like sputtered particle) may flake off from the sputtering target. In that case, the flat-plate-like sputtered particle reaches a substrate while keeping its crystal state, whereby the CAAC-OS film can be formed over the substrate.

For the deposition of the CAAC-OS film, the following conditions are preferably used.

By reducing the mixing of impurities during the deposition, the crystal state can be prevented from being broken by the impurities. For example, the concentration of impurities (e.g., hydrogen, water, carbon dioxide, or nitrogen) which exist in the deposition chamber may be reduced. Furthermore, the concentration of impurities in a deposition gas may be reduced. Specifically, a deposition gas whose dew point is −80° C. or lower, preferably −100° C. or lower is used.

By increasing the substrate heating temperature during the deposition, migration of a sputtered particle is likely to occur after the sputtered particle is attached to a substrate surface. Specifically, the substrate heating temperature during the deposition is higher than or equal to 100° C. and lower than or equal to 740° C., preferably higher than or equal to 200° C. and lower than or equal to 500° C. By increasing the substrate heating temperature during the deposition, when the flat-plate-like sputtered particle reaches the substrate, migration occurs on the substrate surface, so that a flat plane of the flat-plate-like sputtered particle is attached to the substrate.

Furthermore, it is preferable that the proportion of oxygen in the deposition gas be increased and the power be optimized in order to reduce plasma damage at the deposition. The proportion of oxygen in the deposition gas is 30 vol % or higher, preferably 100 vol %.

As an example of the sputtering target, an In—Ga—Zn—O compound target is described below.

The polycrystalline In—Ga—Zn—O compound target is made by mixing $InO_x$ powder, $GaO_y$ powder, and $ZnO_z$ powder in a predetermined molar ratio, applying pressure, and performing heat treatment at a temperature higher than or equal to 1000° C. and lower than or equal to 1500° C. Note that X, Y, and Z are each a given positive number. Here, the predetermined molar ratio of $InO_x$ powder to $GaO_y$ powder and $ZnO_z$ powder is, for example, 2:2:1, 8:4:3, 3:1:1, 1:1:1, 4:2:3, or 3:1:2. The kinds of powders and the molar ratio for mixing the powders may be determined as appropriate depending on the desired sputtering target.

Alternatively, the CAAC-OS film can be formed by plural times of deposition of films. An example of such a method will be described below.

First, a first oxide semiconductor layer is formed to a thickness of greater than or equal to 1 nm and less than 10 nm. The first oxide semiconductor layer is formed by a sputtering method. Specifically, the substrate temperature is set to higher than or equal to 100° C. and lower than or equal to 500° C., preferably higher than or equal to 150° C. and lower than or equal to 450° C., and the proportion of oxygen in a deposition gas is set to higher than or equal to 30 vol %, preferably 100 vol %.

Then, heat treatment is performed to increase the crystallinity of the first oxide semiconductor layer to give a first CAAC-OS film with high crystallinity. The temperature of the heat treatment is higher than or equal to 350° C. and lower than or equal to 740° C., preferably higher than or equal to 450° C. and lower than or equal to 650° C. The heat treatment time is longer than or equal to 1 minute and shorter than or equal to 24 hours, preferably longer than or equal to 6 minutes and shorter than or equal to 4 hours. The heat treatment may be performed in an inert atmosphere or an oxidation atmosphere. It is preferable to perform heat treatment in an inert atmosphere and then perform heat treatment in an oxidation atmosphere. The heat treatment in an inert atmosphere can reduce the concentration of impurities in the first oxide semiconductor layer in a short time. At the same time, the heat treatment in an inert atmosphere may generate oxygen vacancies in the first oxide semiconductor layer. In such a case, the heat treatment in an oxidation atmosphere can reduce the oxygen vacancies. Note that the heat treatment may be performed under a reduced pressure of, for example, 1000 Pa or lower, 100 Pa or lower, 10 Pa or lower, or 1 Pa or lower. The heat treatment under the reduced pressure can reduce the concentration of impurities in the first oxide semiconductor layer in a shorter time.

The first oxide semiconductor layer with a thickness of greater than or equal to 1 nm and less than 10 nm can be more easily crystallized by heat treatment than the first oxide semiconductor layer with a thickness of greater than or equal to 10 nm.

Then, a second oxide semiconductor layer having the same composition as the first oxide semiconductor layer is formed to a thickness of 10 nm to 50 nm inclusive. The second oxide semiconductor layer is formed by a sputtering method. Specifically, the substrate temperature is set to higher than or equal to 100° C. and lower than or equal to 500° C., preferably higher than or equal to 150° C. and lower than or equal to 450° C., and the proportion of oxygen in a deposition gas is set to higher than or equal to 30 vol %, preferably 100 vol %.

Then, heat treatment is performed so that the second oxide semiconductor layer is turned into a second CAAC-OS film with high crystallinity by solid phase growth from the first CAAC-OS film. The temperature of the heat treatment is higher than or equal to 350° C. and lower than or equal to 740° C., preferably higher than or equal to 450° C. and lower than or equal to 650° C. The heat treatment time is longer than or equal to 1 minute and shorter than or equal to 24 hours, preferably longer than or equal to 6 minutes and shorter than or equal to 4 hours. The heat treatment may be performed in an inert atmosphere or an oxidation atmosphere. It is preferable to perform heat treatment in an inert atmosphere and then perform heat treatment in an oxidation atmosphere. The heat treatment in an inert atmosphere can reduce the concentration of impurities in the second oxide semiconductor layer in a short time. At the same time, the heat treatment in an inert atmosphere may generate oxygen vacancies in the second oxide semiconductor layer. In such a case, the heat treatment in an oxidation atmosphere can reduce the oxygen vacancies. Note that the heat treatment may be performed under a reduced pressure of, for example, 1000 Pa or lower, 100 Pa or lower, 10 Pa or lower, or 1 Pa or lower. The heat treatment under the reduced pressure can reduce the concentration of impurities in the second oxide semiconductor layer in a shorter time.

This embodiment can be implemented in combination with any of the other embodiments as appropriate.

Embodiment 4

In this embodiment, structures and fabricating methods of OS transistors will be described with reference to FIGS. 11A to 11C, FIGS. 12A to 12E, FIGS. 13A to 13C, and FIGS. 14A to 14H. The OS transistor of this embodiment can be fabricated, for example, as the OS transistor 503 in FIG. 10.

Structural Example 1 of OS Transistor

Figure 11A:
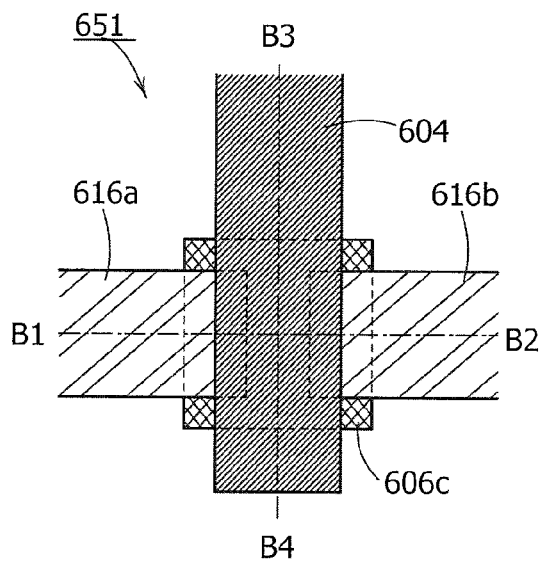
FIG. 11A is a top view illustrating a structural example of an oxide semiconductor transistor.
Figure 11B:
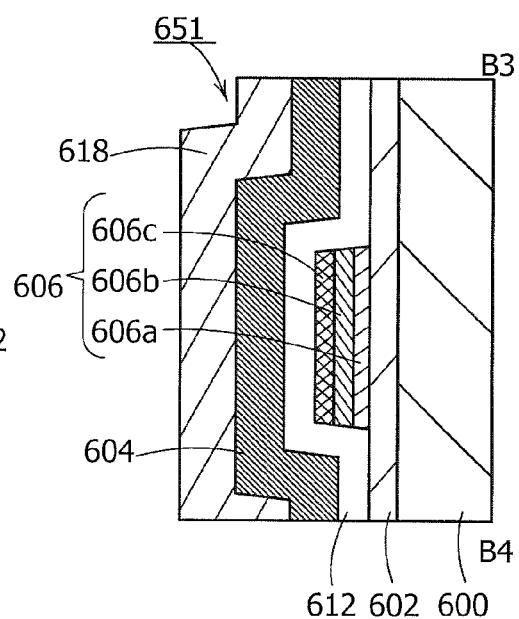
FIG. 11B is a cross-sectional view along B1-B2 in FIG. 11A.
Figure 11C:
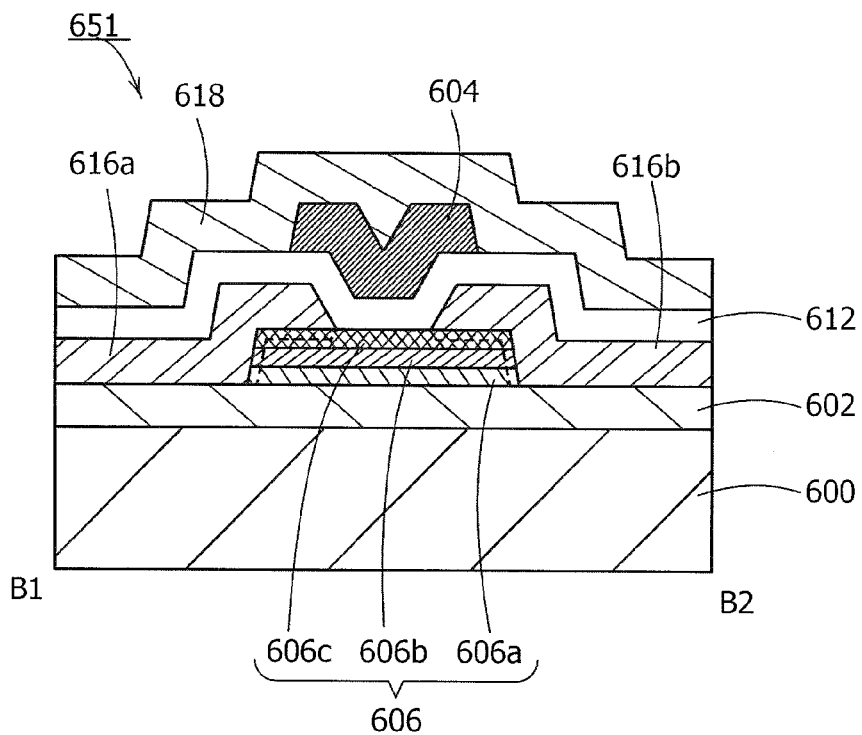
FIG. 11C is a cross-sectional view along B3-B4 in FIG. 11A.

FIGS. 11A to 11C illustrate a structural example of a top-gate OS transistor. FIG. 11A is a top view of an OS transistor 651. FIG. 11B is a cross-sectional view along B1-B2 in FIG. 11A. FIG. 11C is a cross-sectional view along B3-B4 in FIG. 11A.

As illustrated in FIG. 11B, the OS transistor 651 includes a base insulating film 602 over a substrate 600, a multilayer film 606 over the base insulating film 602, a source electrode 616a, a drain electrode 616b, a gate insulating film 612, a gate electrode 604, and a protective insulating film 618.

The gate insulating film 612 is provided over the source electrode 616a and the drain electrode 616b. The source electrode 616a and the drain electrode 616b are provided over the base insulating film 602 and the multilayer film 606. The source electrode 616a and the drain electrode 616b are provided in contact with side edges of the multilayer film 606. The protective insulating film 618 is provided over the gate insulating film 612 and the gate electrode 604.

The multilayer film 606 includes an oxide layer 606a over the base insulating film 602, an oxide semiconductor layer 606b over the oxide layer 606a, and an oxide layer 606c over the oxide semiconductor layer 606b.

Although the multilayer film 606 in the OS transistor 651 described here has a three-layer structure, the number of layers which are stacked is not limited to three and the multilayer film 606 includes a plurality of stacked oxide layers; a two-layer structure or a four-layer structure may be employed. The multilayer film 606 can have a two-layer structure of the oxide layer 606a and the oxide semiconductor layer 606b, for example.

Although the base insulating film 602 and the protective insulating film 618 are included in the OS transistor 651 here, one or both of these films are not necessarily included in the OS transistor 651.

As illustrated in FIG. 11B, depending on a kind of a conductive film used for the source electrode 616a and the drain electrode 616b, part of the multilayer film 606 is deprived of oxygen by the source electrode 616a and the drain electrode 616b, whereby n-type regions (source and drain regions) may be formed in parts of the multilayer film 606. FIG. 11B illustrates an example where such n-type regions are formed in the multilayer film 606. In FIG. 11B, the boundaries of the n-type regions are indicated by dotted lines.

The n-type region is a region where a large amount of oxygen vacancies exist in the multilayer film 606 and is formed by forming a conductive film to be the source electrode 616a and the drain electrode 616b. Although not illustrated, oxygen in the multilayer film 606 is mixed into regions of the source electrode 616a and the drain electrode 616b that are in contact with the multilayer film 606, so that mixed layers are formed in the region in some cases.

In FIG. 11A, in a region which overlaps with the gate electrode 604, a distance between the source electrode 616a and the drain electrode 616b is referred to as a channel length. Note that in the case where the OS transistor 651 includes a source region and a drain region, a distance between the source region and the drain region in the region overlapping with the gate electrode 604 may be referred to as a channel length.

Note that a channel formation region corresponds to a region of the multilayer film 606 that overlaps with the gate electrode 604 and is positioned between the source electrode 616a and the drain electrode 616b. Further, a channel refers to a region through which current mainly flows in the channel formation region. Here, the channel is part of the oxide semiconductor layer 606b in the channel formation region.

The oxide layer 606c contains one or more kinds of elements contained in the oxide semiconductor layer 606b. The energy of the bottom of the conduction band in the oxide layer 606c is located closer to the vacuum level than that in the oxide semiconductor layer 606b by 0.05 eV or more, 0.07 eV or more, 0.1 eV or more, or 0.15 eV or more and 2 eV or less, 1 eV or less, 0.5 eV or less, or 0.4 eV or less. Note that to increase the carrier mobility of the oxide semiconductor layer 606b, the oxide semiconductor layer 606b preferably contains at least indium. In this case, application of an electric field to the gate electrode 604 forms a channel in the oxide semiconductor layer 606b in the multilayer film 606, where the energy of the bottom of the conduction band is low. That is, when the oxide layer 606c is provided between the oxide semiconductor layer 606b and the gate insulating film 612, the channel of the OS transistor 651 can be formed in the oxide semiconductor layer 606b that is not in contact with the gate insulating film 612. Further, since the oxide layer 606c contains one or more kinds of elements contained in the oxide semiconductor layer 606b, interface scattering is not likely to occur at the interface between the oxide semiconductor layer 606b and the oxide layer 606c. Thus, carriers are not inhibited from moving at the interface, which results in an increase in the field-effect mobility of the OS transistor 651.

The oxide layer 606c has a thickness greater than or equal to 3 nm and less than or equal to 100 nm, preferably greater than or equal to 3 nm and less than or equal to 50 nm. The oxide semiconductor layer 606b has a thickness greater than or equal to 3 nm and less than or equal to 200 nm, preferably greater than or equal to 3 nm and less than or equal to 100 nm, more preferably greater than or equal to 3 nm and less than or equal to 15 nm. The oxide layer 606a has a thickness greater than or equal to 3 nm and less than or equal to 100 nm, preferably greater than or equal to 3 nm and less than or equal to 50 nm.

The oxide layer 606a contains one or more kinds of elements contained in the oxide semiconductor layer 606b. The energy of the bottom of the conduction band in the oxide layer 606a is located closer to the vacuum level than that in the oxide semiconductor layer 606b by 0.05 eV or more, 0.07 eV or more, 0.1 eV or more, or 0.15 eV or more and 2 eV or less, 1 eV or less, 0.5 eV or less, or 0.4 eV or less. Since the oxide layer 606a contains one or more kinds of elements contained in the oxide semiconductor layer 606b, an interface state is not likely to be formed at the interface between the oxide semiconductor layer 606b and the oxide layer 606a. When the interface has an interface state, a second transistor in which the interface serves as a channel and which has a different threshold voltage is formed; accordingly, the apparent threshold voltage of the OS transistor 651 might be changed. Thus, providing the oxide layer 606a makes it possible to reduce variation in the electrical characteristics of the OS transistor 651, such as the threshold voltage.

For example, each of the oxide layer 606a and the oxide layer 606c can be an oxide layer which contains the same elements as those of the oxide semiconductor layer 606b (i.e., indium, gallium, and zinc) as the main components and in which the atomic proportion of gallium is higher than that of the oxide semiconductor layer 606b. Specifically, an oxide layer in which the atomic proportion of gallium is 1.5 times or more, preferably 2 times or more, more preferably 3 times or more that of the oxide semiconductor layer 606b is used as each of the oxide layer 606a and the oxide layer 606c. Gallium is strongly bonded to oxygen, and thus has a function of preventing generation of oxygen vacancies in the oxide layer. In other words, the oxide layer 606a and the oxide layer 606c are oxide layers in which oxygen vacancies are less likely to be generated than in the oxide semiconductor layer 606b.

Note that the oxide layer 606a, the oxide semiconductor layer 606b, and the oxide layer 606c are amorphous or crystalline. It is preferable that the oxide layer 606a be amorphous or crystalline, the oxide semiconductor layer 606b be crystalline, and the oxide layer 606c be amorphous. When the oxide semiconductor layer 606b in which the channel is formed is crystalline, the OS transistor 651 can have stable electrical characteristics.

The other components of the OS transistor 651 will be described below.

As the substrate 600, an insulating substrate such as a glass substrate or a quartz substrate can be used. Alternatively, the semiconductor substrate described in Embodiment 2 can be used.

The source electrode 616a and the drain electrode 616b may be formed with a single layer or a stack using one or more conductive films containing one or more of aluminum, titanium, chromium, cobalt, nickel, copper, yttrium, zirconium, molybdenum, ruthenium, silver, tantalum, and tungsten. Note that the source electrode 616a and the drain electrode 616b may have the same composition or different compositions. For example, a stack including a tungsten film and a tantalum nitride film is used.

Note that although the multilayer film 606 is formed such that the edge thereof is on the outer side than the edge of the gate electrode 604 in FIG. 11A, the multilayer film 606 may be formed such that the edge thereof is on the inner side than the edge of the gate electrode 604, in order to prevent generation of carriers in the multilayer film 606 due to light.

The base insulating film 602 may be formed with a single layer or a stack using an insulating film containing one or more of substances such as an aluminum oxide, a magnesium oxide, a silicon oxide, a silicon oxynitride, a silicon nitride oxide, a silicon nitride, a gallium oxide, a germanium oxide, a yttrium oxide, a zirconium oxide, a lanthanum oxide, a neodymium oxide, a hafnium oxide, and a tantalum oxide.

For example, the base insulating film 602 may be a multilayer film of a silicon nitride layer as the first layer and a silicon oxide layer as the second layer. In that case, a silicon oxynitride layer may be used instead of the silicon oxide layer. In addition, a silicon nitride oxide layer may be used instead of the silicon nitride layer. As the silicon oxide layer, a silicon oxide layer whose defect density is low is preferably used. Specifically, a silicon oxide layer whose spin density with a g factor of 2.001 is lower than or equal to $3\times10^{17}$ spins/cm$^3$, preferably lower than or equal to $5\times10^{16}$ spins/cm$^3$ is used. Note that a g factor and spin density can be calculated from an ESR spectrum measured by an electron spin resonance (ESR) spectrometer. As the silicon nitride layer, a silicon nitride layer from which hydrogen and ammonia are less likely to be released is used. The amount of released hydrogen and ammonia may be measured by thermal desorption spectroscopy (TDS). Further, as the silicon nitride layer, a silicon nitride layer through which oxygen does not penetrate or hardly penetrates is used.

Alternatively, for example, the base insulating film 602 may be a multilayer film of a first silicon nitride layer as the first layer, a first silicon oxide layer as the second layer, and a second silicon oxide layer as the third layer. In that case, a silicon oxynitride layer may be used instead of the first and/or second silicon oxide layer. In addition, a silicon nitride oxide layer may be used instead of the silicon nitride layer. As the first silicon oxide layer, a silicon oxide layer whose defect density is low is preferably used. Specifically, a silicon oxide layer whose density of an electron spin with a g factor of 2.001 is lower than or equal to $3\times10^{17}$ spins/cm$^3$, preferably lower than or equal to $5\times10^{16}$ spins/cm$^3$ is used. As the second oxide layer, a silicon oxide layer containing excess oxygen is used. As the silicon nitride layer, a silicon nitride layer from which hydrogen and ammonia are less likely to be released is used. Further, as the silicon nitride layer, a silicon nitride layer through which oxygen does not penetrate or hardly penetrates is used.

The silicon oxide layer containing excess oxygen refers to a silicon oxide layer that can release oxygen by heat treatment or the like. When the above definition of the silicon oxide layer is applied broadly to an insulating film, an insulating film having excess oxygen means an insulating film from which oxygen is released by heat treatment.

Here, the film from which oxygen is released by heat treatment refers to a film that releases oxygen the amount of which is higher than or equal to $1\times10^{18}$ atoms/cm$^3$, higher than or equal to $1\times10^{19}$ atoms/cm$^3$, or higher than or equal to $1\times10^{20}$ atoms/cm$^3$ in TDS analysis in a temperature range of a film surface from 100° C. to 700° C., preferably from 100° C. to 500° C. (converted into the number of oxygen atoms).

Further, the film from which oxygen is released by heat treatment may contain a peroxide radical. Specifically, the spin density attributed to the peroxide radical is greater than or equal to $5\times10^{17}$ spins/cm$^3$. Note that the film containing a peroxide radical refers to a film that has an asymmetric waveform at a g-factor of around 2.01 in an ESR spectrum.

The insulating film containing excess oxygen may be oxygen-excess silicon oxide ($SiO_x$ (X>2)). In the oxygen-excess silicon oxide ($SiO_x$ (X>2)), the number of oxygen atoms per unit volume is more than twice the number of silicon atoms per unit volume. The number of silicon atoms and the number of oxygen atoms per unit volume are measured by Rutherford backscattering spectrometry (RBS).

In the case where at least one of the gate insulating film 612 and the base insulating film 602 includes an insulating film containing excess oxygen, oxygen vacancies in the oxide semiconductor layer 606b can be reduced.

The protective insulating film 618 may be formed with a single layer or a stack of an insulating film containing one or more of an aluminum oxide, a magnesium oxide, a silicon oxide, a silicon oxynitride, a silicon nitride oxide, a silicon nitride, a gallium oxide, a germanium oxide, an yttrium oxide, a zirconium oxide, a lanthanum oxide, a neodymium oxide, a hafnium oxide, and a tantalum oxide.

Example 1 of Fabricating Method of OS Transistor

Here, an example of a method for fabricating the OS transistor 651 will be described with reference to FIGS. 12A to 12E.

First, the substrate 600 over which the base insulating film 602 is formed is prepared. As the base insulating film 602, a silicon oxide layer containing excess oxygen is formed using a sputtering apparatus.

Then, an oxide layer to be the oxide layer 606a is formed. A 20-nm-thick IGZO (In:Ga:Zn=1:3:2) film is formed as the oxide layer 606a. Note that the IGZO (In:Ga:Zn=1:3:2) film is formed under the following deposition conditions: a sputtering apparatus is used; the substrate temperature is 200° C., the flow rates of Ar and $O_2$ are 30 sccm and 15 sccm, respectively; the deposition pressure is 0.4 Pa; the deposition power (DC) is 0.5 kW; and the distance between the substrate and the target (T-S distance) is 60 mm.

Then, an oxide semiconductor layer to be the oxide semiconductor layer 606b is formed. A 15-nm-thick IGZO (In:Ga:Zn=1:1:1) film is formed as the oxide semiconductor layer 606b. Note that the IGZO (In:Ga:Zn=1:1:1) film is formed under the following deposition conditions: a sputtering apparatus is used; the substrate temperature is 300° C., the flow rates of Ar and $O_2$ are 30 sccm and 15 sccm, respectively; the deposition pressure is 0.4 Pa; the deposition power (DC) is 0.5 kW; and the distance between the substrate and the target (T-S distance) is 60 mm.

Then, an oxide layer to be the oxide layer 606c is formed. A 5-nm-thick IGZO (In:Ga:Zn=1:3:2) film is formed as the oxide layer 606c. Note that when being formed using a sputtering apparatus, the IGZO (In:Ga:Zn=1:3:2) film can be formed under the following deposition conditions: the substrate temperature is 200° C., the flow rates of Ar and $O_2$ are 30 sccm and 15 sccm, respectively; the deposition pressure is 0.4 Pa; the deposition power (DC) is 0.5 kW; and the distance between the substrate and the target (T-S distance) is 60 mm.

Next, first heat treatment is preferably performed. The first heat treatment is performed at a temperature higher than or equal to 250° C. and lower than or equal to 650° C., preferably higher than or equal to 300° C. and lower than or equal to 500° C. The first heat treatment is performed in an inert gas atmosphere, in an atmosphere containing an oxidizing gas at 10 ppm or more, 1% or more, or 10% or more, or under reduced pressure. Alternatively, the first heat treatment may be performed in such a manner that heat treatment is performed in an inert gas atmosphere, and then another heat treatment is performed in an atmosphere containing an oxidizing gas at 10 ppm or more, 1% or more, or 10% or more in order to compensate desorbed oxygen. Through the first heat treatment, the crystallinity of the oxide semiconductor layer to be the oxide semiconductor layer 606b can be increased, and impurities such as hydrogen and water can be removed from the base insulating film 602, the oxide layer to be the oxide layer 606a, the oxide semiconductor layer to be the oxide semiconductor layer 606b and/or the oxide layer to be the oxide layer 606c.

Figure 12A:
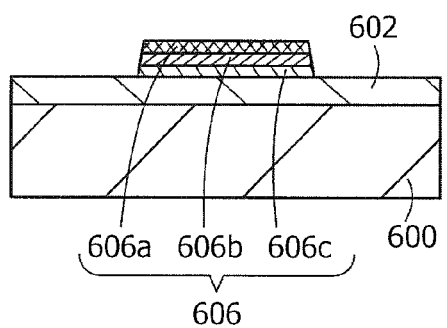
FIGS. 12A to 12E are cross-sectional views illustrating an example of a method for manufacturing the transistor in FIG. 11A.
Figure 12D:
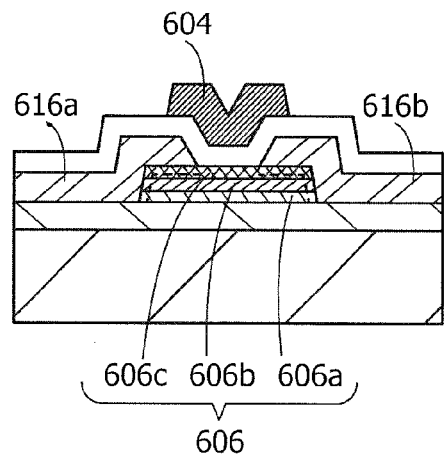
Figure 12B:
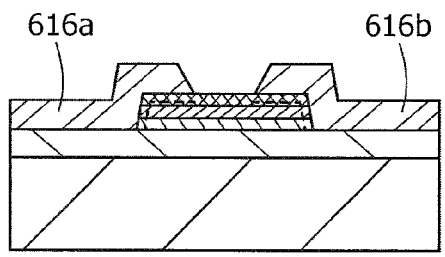
Figure 12E:
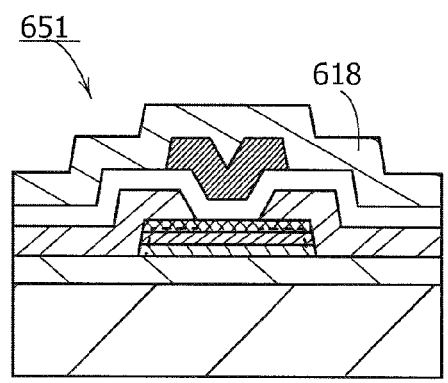

Next, the oxide layer to be the oxide layer 606a, the oxide semiconductor layer to be the oxide semiconductor layer 606b, and the oxide layer to be the oxide layer 606c are partly etched to form the multilayer film 606 including the oxide layer 606a, the oxide semiconductor layer 606b, and the oxide layer 606c (see FIG. 12A).

Next, a conductive film to be the source electrode 616a and the drain electrode 616b is formed. For example, when a tungsten film is used as the conductive film, the tungsten film extracts oxygen from the multilayer film 606, so that an n-type region is formed in regions of the multilayer film 606 that are in contact with the tungsten film. When a titanium film is used as the conductive film, titanium is diffused to regions of the multilayer film 606 that are in contact with the titanium film, so that the regions become n-type. Next, this conductive film is partly etched to form the source electrode 616a and the drain electrode 616b (see FIG. 12B).

Then, second heat treatment is preferably performed. The second heat treatment can be performed in a manner similar to that of the first heat treatment. Through the second heat treatment, impurities such as hydrogen and water can be removed from the multilayer film 606. In addition, through the second heat treatment, oxygen is supplied to exposed regions of the multilayer film 606, so that the regions that have been made to be n-type in formation of the source electrode 616a and the drain electrode 616b become i-type.

Figure 12C:
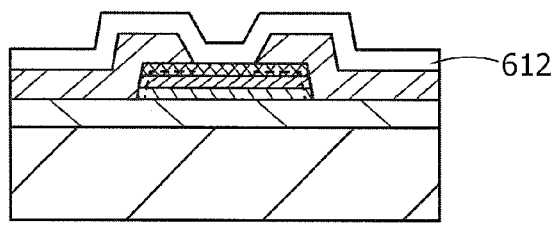

Then, the gate insulating film 612 is formed (see FIG. 12C). The gate insulating film 612 may be a multilayer film including a first silicon oxide layer as the first layer, a second silicon oxide layer as the second layer, and a silicon nitride layer as the third layer. In that case, a silicon oxynitride layer may be used instead of the first silicon oxide layer and/or the second silicon oxide layer. Further, a silicon nitride oxide layer may be used instead of the silicon nitride layer. As the first silicon oxide layer, a silicon oxide layer whose defect density is low is preferably used. Specifically, a silicon oxide layer whose density of a spin corresponding to a signal with a g factor of 2.001 in ESR is less than or equal to $3 \times 10^{17}$ spins/cm$^3$, preferably less than or equal to $5 \times 10^{16}$ spins/cm$^3$ is used. As the second silicon oxide layer, a silicon oxide layer containing excess oxygen is used. As the silicon nitride layer, a silicon nitride layer from which hydrogen and ammonia are less likely to be released is used. Further, as the silicon nitride layer, a silicon nitride layer through which oxygen does not penetrate or hardly penetrates is used.

Next, a conductive film to be the gate electrode 604 is formed. Then, this conductive film is partly etched to form the gate electrode 604 (see FIG. 12D). Subsequently, the protective insulating film 618 is formed (see FIG. 12E).

In this manner, the OS transistor 651 can be fabricated.

Since oxygen vacancies in the oxide semiconductor layer 606b of the multilayer film 606 are reduced, the OS transistor 651 has stable electrical characteristics.

Structure Example 2 of OS Transistor

Next, an example of an OS transistor having a structure different from that of the OS transistor 651 will be described with reference to FIGS. 13A to 13C.

Figure 13A:
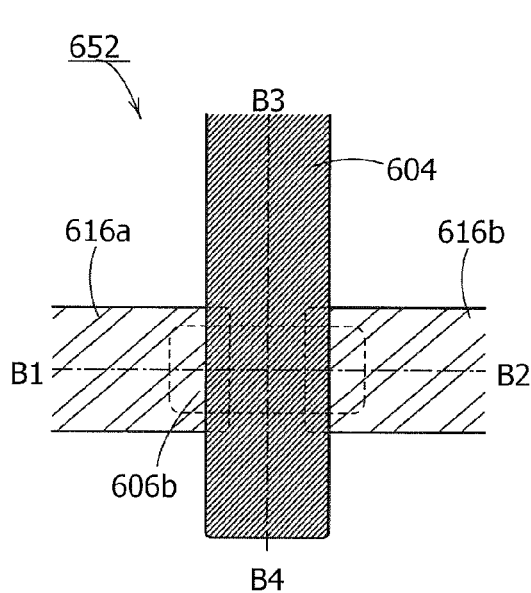
FIG. 13A is a top view illustrating a structural example of an oxide semiconductor transistor.
Figure 13C:
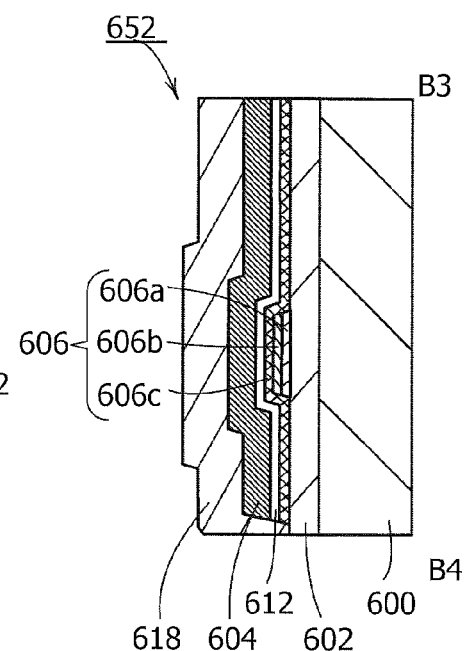
FIG. 13C is a cross-sectional view along B3-B4 in FIG. 13A.
Figure 13B:
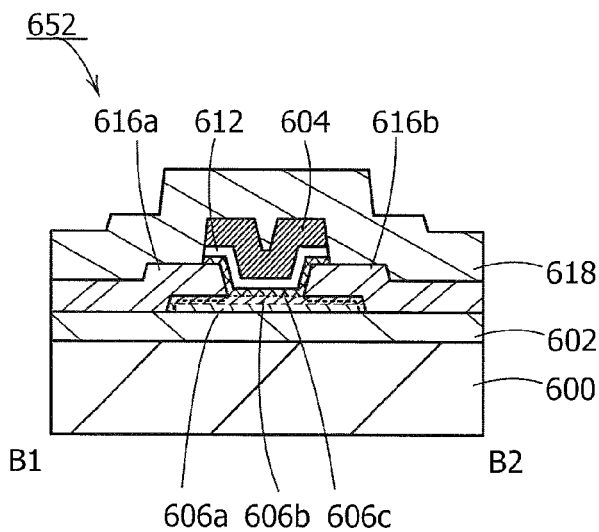
FIG. 13B is a cross-sectional view along B1-B2 in FIG. 13A.

FIGS. 13A to 13C illustrate a structure example of a top-gate OS transistor. FIG. 13A is a top view of an OS transistor. FIG. 13B is a cross-sectional view along B1-B2 in FIG. 13A. FIG. 13C is a cross-sectional view along B3-B4 in FIG. 13A.

As illustrated in FIGS. 13A to 13C, an OS transistor 652 includes the base insulating film 602 over the substrate 600, the multilayer film 606 over the base insulating film 602, the source electrode 616a, the drain electrode 616b, the gate insulating film 612, the gate electrode 604, and the protective insulating film 618.

The oxide layer 606a and the oxide semiconductor layer 606b are stacked over the base insulating film 602. The source electrode 616a and the drain electrode 616b are provided over and in contact with the stack including the oxide layer 606a and the oxide semiconductor layer 606b. The oxide layer 606c is provided over the stack, the source electrode 616a, and the drain electrode 616b. The gate electrode 604 is provided over the oxide layer 606c with the gate insulating film 612 provided therebetween.

Although FIGS. 13B and C illustrate an example where the gate electrode 604, the gate insulating film 612, and the oxide layer 606c have the same planar shape, one embodiment of the present invention is not limited to this example. For example, the oxide layer 606c and/or the gate insulating film 612 may have a portion that is on the outer side than the edge of the gate electrode 604.

Depending on a kind of the conductive film used for the source electrode 616a and the drain electrode 616b, oxygen is removed from part of the oxide semiconductor layer 606b or a mixed layer is formed so that n-type regions are formed in the oxide semiconductor layer 606b in some cases. In FIG. 13B, boundaries of the n-type regions are indicated by dotted lines.

In the plane layout illustrated in FIG. 13A, the gate electrode 604 is provided to overlap with the whole channel formation region. With such a layout, generation of carriers in the channel formation region due to light emitted from the gate electrode 604 side can be prevented. In other words, the gate electrode 604 functions as a light-blocking film in the example in FIG. 13A. It is needless to say that the channel formation region may be formed in a region that does not overlap with the gate electrode 604.

Example 2 of Fabricating Method of OS Transistor

An example of a method for fabricating the OS transistor 652 will be described below with reference to FIGS. 14A to 14H. Fabricating steps of the OS transistor 652 similar to those of the OS transistor 651 are conducted according to the procedure for the OS transistor 651.

First, the substrate 600 is prepared. Next, the base insulating film 602 is formed. Next, the oxide layer 636a and the oxide semiconductor layer 636b are formed in this order (see FIG. 14A).

Figure 14A:
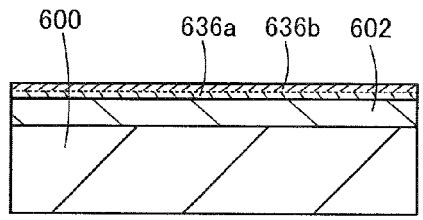
FIGS. 14A to 14H are cross-sectional views illustrating an example of a method for manufacturing the transistor in FIG. 13A.
Figure 14B:
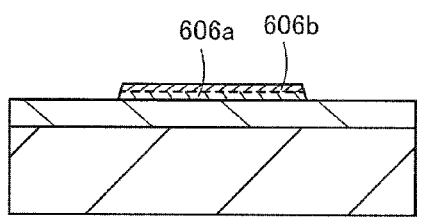

Then, the oxide layer 636a and the oxide semiconductor layer 636b are partly etched to form the oxide layer 606a and the oxide semiconductor layer 606b that have an island shape (see FIG. 14B). It is preferable that the first heat treatment be performed before this etching.

Figure 14C:
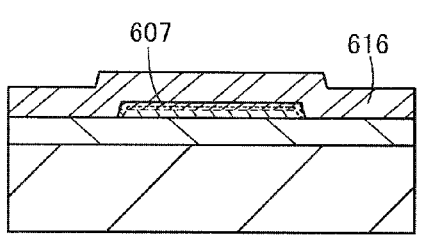

Next, a conductive film 616 is formed (see FIG. 14C). With formation of the conductive film 616, the n-type region 607 is formed over the stack including the oxide layer 606a and the oxide semiconductor layer 606b in some cases.

Figure 14D:
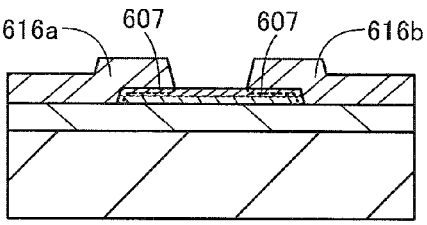

Next, the conductive film 616 is partly etched to form the source electrode 616a and the drain electrode 616b (see FIG. 14D). Then, second heat treatment is preferably performed. Through the second heat treatment, oxygen is supplied to an exposed part of the n-type region 607 in the oxide semiconductor layer 606b to form an i-type region in some cases (see FIG. 14D).

Figure 14E:
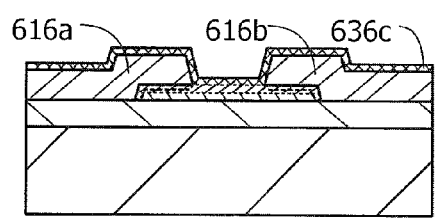

Then, an oxide layer 636c is formed (see FIG. 14E).

Next, an insulating film 642 is formed. The insulating film 642 can be formed by a plasma CVD method, for example. By the CVD method, a denser insulating film having a lower density of defects can be provided as a substrate temperature is higher. The insulating film 642 after being processed serves as the gate insulating film 612; thus, the transistor can have more stable electrical characteristics as the insulating film 642 is denser and has a lower defect density. On the other hand, when the base insulating film 602 contains excess oxygen, the transistor can have stable electrical characteristics. However, by raising the substrate temperature when the base insulating film 602 is exposed, oxygen is released from the base insulating film 602, so that excess oxygen is reduced.

Here, because the base insulating film 602 is covered with the oxide layer 636c at the time of formation of the insulating film 642, oxygen can be prevented from being released from the base insulating film 602. Therefore, the insulating film 642 can be dense and have a low defect density, without reducing excess oxygen contained in the base insulating film 602. For this reason, the reliability of the transistor can be improved.

Figure 14F:
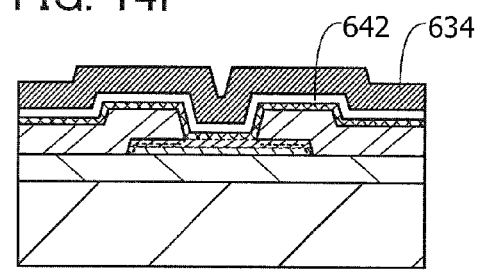
Figure 14G:
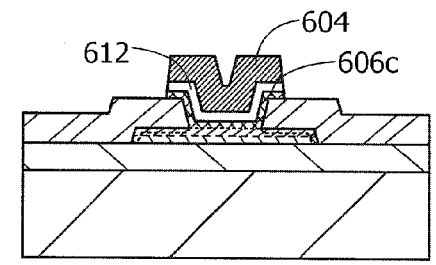
Figure 14H:
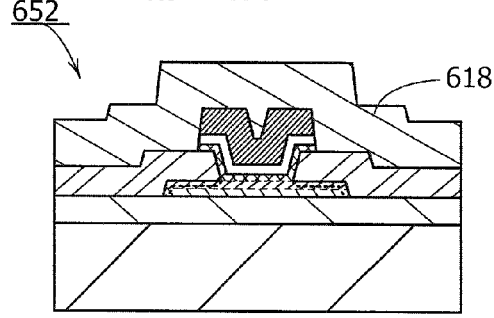

Next, a conductive film 634 is formed (see FIG. 14F). Then, the oxide layer 636c, the insulating film 642, and the conductive film 634 are partly etched to form the oxide layer 606c, the gate insulating film 612, and the gate electrode 604 (see FIG. 14G).

Next, the protective insulating film 618 is formed. Through the above steps, the OS transistor 652 illustrated in FIG. 13A to 13C can be fabricated (see FIG. 14H). After the protective insulating film 618 is formed, third heat treatment is preferably performed. The third heat treatment can be performed in a manner similar to that of the first heat treatment.

In each of the transistors 651 and 652, a channel is formed in the oxide semiconductor layer 606b of the multilayer film 606; accordingly, the transistors have stable electrical characteristics and high field-effect mobility.

This embodiment can be implemented in combination with any of the other embodiments as appropriate.

Embodiment 5

In this embodiment, descriptions will be given of electronic devices each incorporating the IC chip described in Embodiment 3 as an electronic component.

Examples of such electronic devices are display devices, personal computers, and image reproducing devices provided with recording media (devices that read image data of recording media such as digital versatile discs (DVDs) and have displays for displaying images). Other examples are mobile phones, game consoles including portable game consoles, portable information terminals, e-book readers, cameras such as video cameras and digital still cameras, goggle-type displays (head mounted displays), navigation systems, audio reproducing devices (e.g., car audio systems and digital audio players), copiers, facsimiles, printers, and multifunction printers. FIGS. 15A to 15F show specific examples of these electronic devices.

Figure 15A:
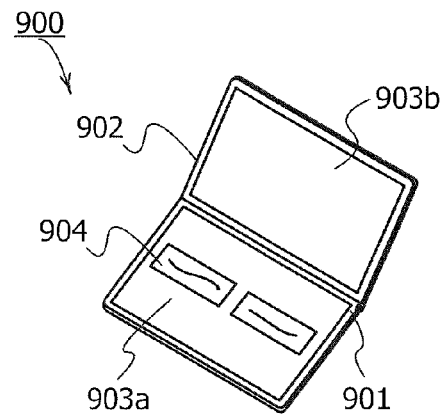
FIGS. 15A to 15F are external views illustrating examples of electronic devices.
Figure 15B:
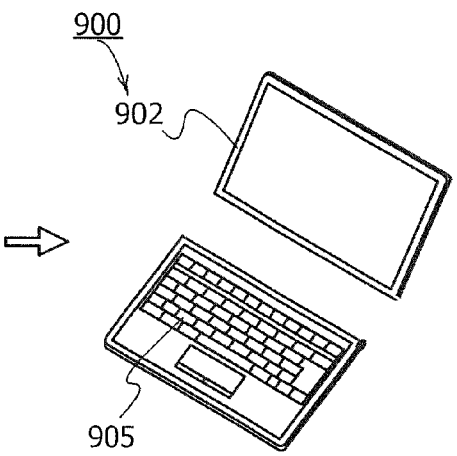

FIGS. 15A and 15B illustrates a portable information terminal 900 that includes a housing 901, a housing 902, a display portion 903a, a display portion 903b, and the like.

Note that the display portion 903a is a touch panel. For example, as illustrated in FIG. 15A, which of "touch input" and "keyboard input" is performed can be selected by a selection button 904 displayed on the display portion 903a. Since the selection buttons with a variety of sizes can be displayed, the information terminal can be easily used by people of any generation. For example, when "touch input" is selected, a keyboard 905 is displayed on the display portion 903a as illustrated in FIG. 15B.

One of the display portion 903a and the display portion 903b can be detached from the information terminal 900 as illustrated in FIG. 15B. For example, when the display portion 903a is provided with a touch input function and the display portion 903b is detachable, the information terminal 900 can be more convenient.

The information terminal 900 has a function of displaying various kinds of data (e.g., a still image, a moving image, and a text image) on the display portion, a function of displaying a calendar, a date, the time, or the like on the display portion, a function of operating or editing the data displayed on the display portion, a function of controlling processing by various kinds of software (programs), and the like. Furthermore, an external connection terminal (an earphone terminal, a USB terminal, or the like), a recording medium insertion portion, and the like may be provided on the back surface or the side surface of the housing 901 or 902.

The information terminal 900 may transmit and receive data wirelessly. Through wireless communication, desired book data or the like can be purchased and downloaded from an e-book server. Further, the housing 902 may be equipped with a device such as an antenna or a microphone so that the information terminal 900 can have a phone call function; thus, the information terminal 900 can be used as a mobile phone.

Figure 15C:
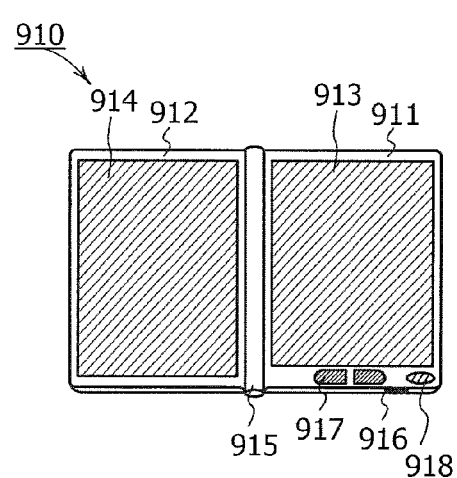

FIG. 15C illustrates an e-book reader 910 in which electronic paper is incorporated as a display means. The e-book reader 910 includes two housings of a housing 911 and a housing 912. The housing 911 and the housing 912 are provided with a display portion 913 and a display portion 914, respectively. The housings 911 and 912 are connected by a hinge portion 915 and can be opened or closed with the hinge portion 915 as an axis. The housing 911 is provided with a power switch 916, an operation key 917, a speaker 918, and the like.

Figure 15D:
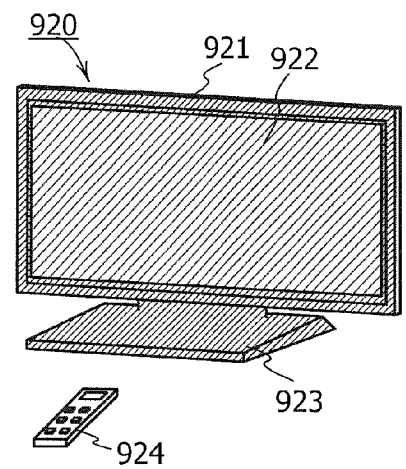

FIG. 15D illustrates a television device 920 including a housing 921, a display portion 922, a stand 923, and the like. The television device 920 can operate with a switch of the housing 921 and a remote controller 924.

Figure 15E:
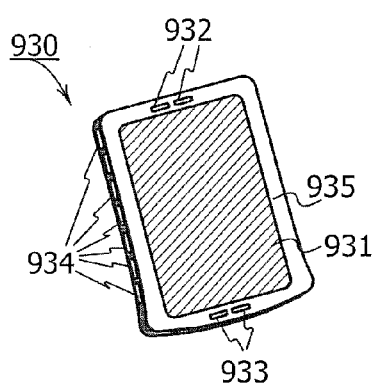

FIG. 15E illustrates a smartphone 930 in which a main body 935 is provided with a display portion 931, a speaker 932, a microphone 933, operation keys 934, and the like.

Figure 15F:
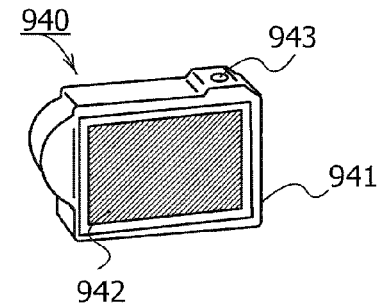

FIG. 15F illustrates a digital camera 940 including a main body 941, a display portion 942, an operation switch 943, and the like.

Example 1

In this example, verification results of operations of a memory as a semiconductor device including a flash ADC will be described. Specifically, a die of a memory capable of storing multilevel data was fabricated and an operation of converting an output signal from a memory cell into a 3-bit digital signal by an ADC was examined.

The memory of this example is called a "NOSRAM". "NOSRAM" stands for a nonvolatile oxide semiconductor random access memory and is one kind of rewritable memories including memory cells formed using OS transistors.

<Configuration of NOSRAM>

Figure 16A:
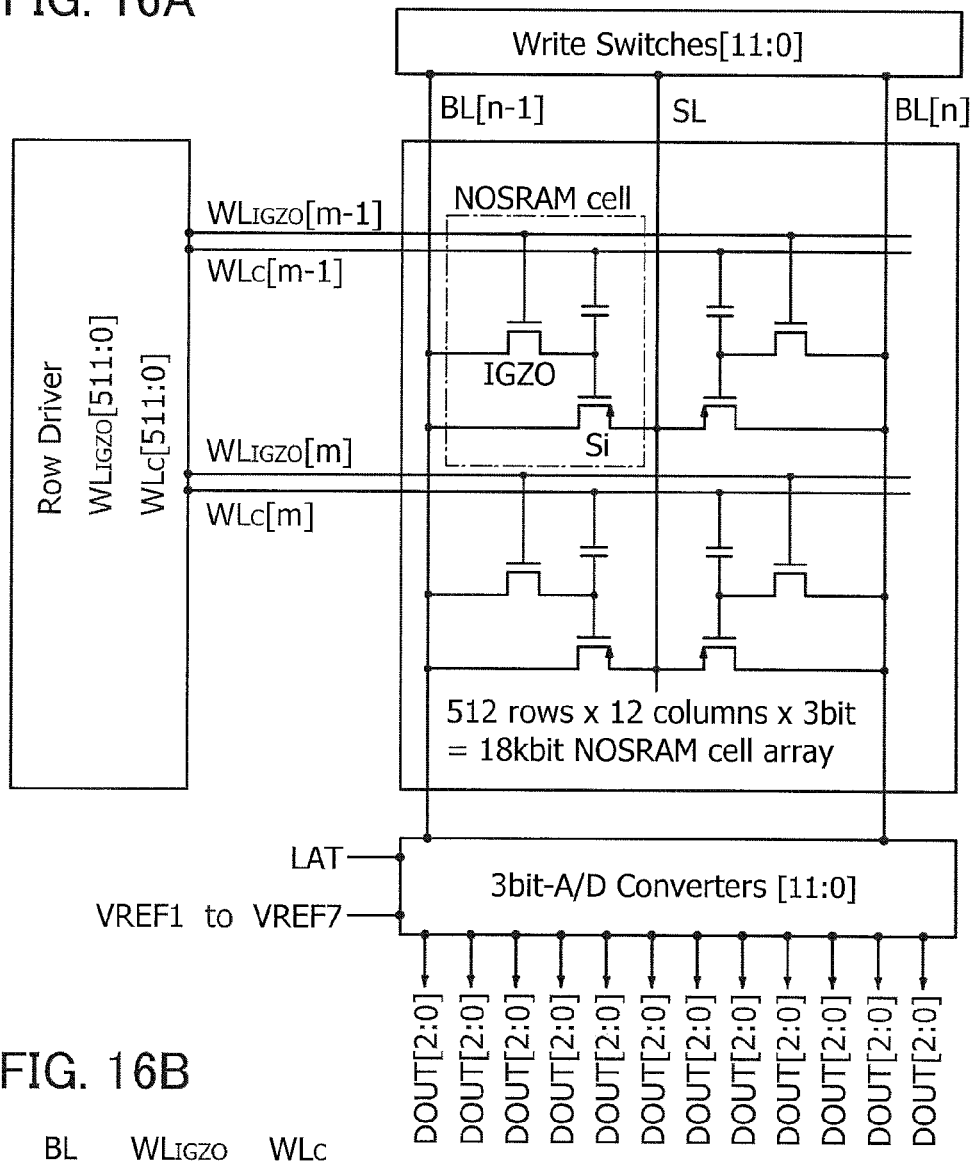
FIG. 16A is a block diagram of a verification die (NOSRAM)
Figure 16B:
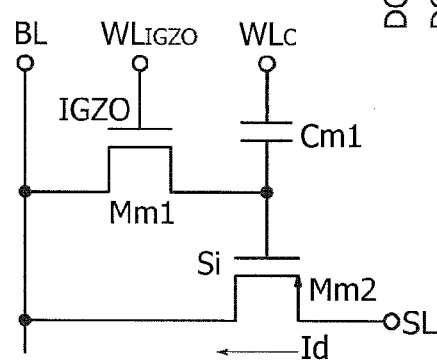
FIG. 16B is a circuit diagram of a memory cell.
Figures 17A, 17B:
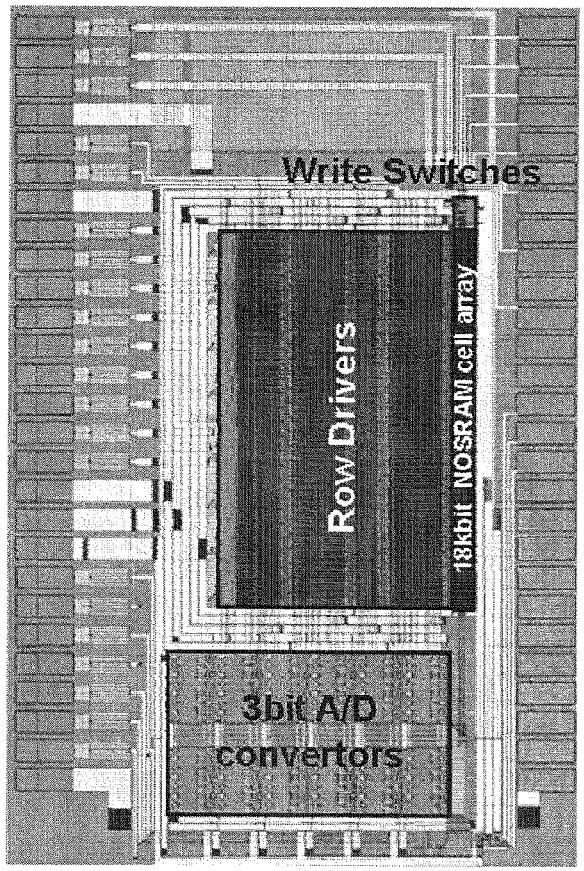
FIG. 17A is a micrograph of a verification die.
FIG. 17B is a spec sheet thereof.

FIG. 16A is a block diagram of a verification die, and FIG. 16B is a circuit diagram of a NOSRAM cell. FIG. 17A is a micrograph of an actually fabricated verification die, and FIG. 17B is a spec sheet of the NOSRAM (verification die).

The NOSRAM cell is formed using an OS transistor having a special characteristic of a significantly low off-state current on the order of yoctoamperes per micrometer ($y=10^{-24}$) like a comparator of an ADC. In this example, an IGZO film with a CAAC structure is used as an oxide semiconductor film included in the OS transistor. Thus, the OS transistor in this example is called a "CAAC-IGZO transistor".

As illustrated in FIG. 16B, the NOSRAM cell includes a transistor Mm1 for data writing, a transistor Mm2 for data reading, and a capacitor Cm1 that stores charge and controls the gate voltage of the transistor Mm2. $WL_{IGZO}$ is a writing word line, and WLc is a reading word line. BL is a bit line, and SL is a source line. SL is provided as a common wiring in a NOSRAM cell array.

The transistor Mm1 is a CAAC-IGZO transistor, and the transistor Mm2 is a Si transistor. The process technology for the transistor Mm1 and the transistor Mm2 is a 0.45 μm process technology, and the capacitance value of the capacitor Cm1 is 2 fF (see FIG. 17B).

The ADC is connected to 12 BL outputs. The ADC is a 3-bit ADC having a function of correcting an offset voltage. In the verification die, the ADC 111 (FIG. 8) in which outputs of the encoder 130 are provided with latch circuits was fabricated. As a comparator of this ADC, the comparator 104 in FIG. 7 was used. An output signal from a BL is input as an input signal VIN to the comparator of the verification die.

<Operations of NOSRAM>

The operations of the fabricated NOSRAM will be described.

[Writing Operation]

Figure 18A:
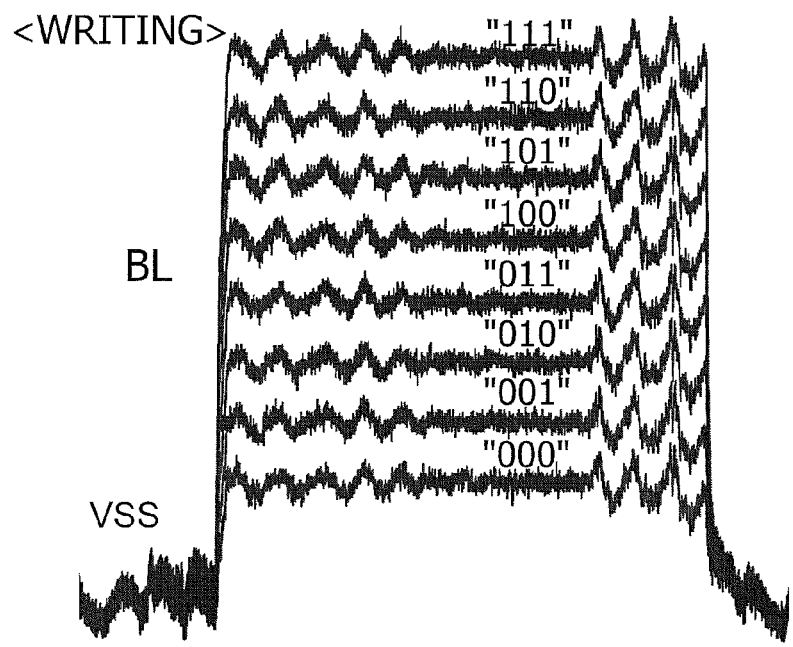
FIG. 18A shows waveforms of signals input to a bit line in a writing operation.

FIG. 18A shows the waveforms of signals input to a BL in writing data to a NOSRAM cell. For the fabricated NOSRAM, a writing voltage was changed by 0.3 V every time a digital code changes by 1. Writing voltages for digital codes "111" to "000" are 2.7 V, 2.4 V, 2.1 V, 1.8 V, 1.5 V, 1.2 V, 0.9 V, and 0.6 V.

In the writing operation, first, VSS is applied to a WLc of a selected row and VH is applied to a $WL_{IGZO}$ of the selected row to turn on the transistor Mm1. Next, an octal-value voltage corresponding to 3-bit data is output to 12 BLs through a writing switch. The voltage applied to the BLs are directly applied to the capacitor Cm1 of the NOSRAM cell of the selected row. That is, 3-bit data can be written per row. Finally, the voltage of the $WL_{IGZO}$ of the selected row is set to VL and the voltage of the WLc is set to VH to turn off the transistors Mm1 and Mm2, so that the writing operation is completed.

[Reading and A/D Conversion]

Figure 18B:
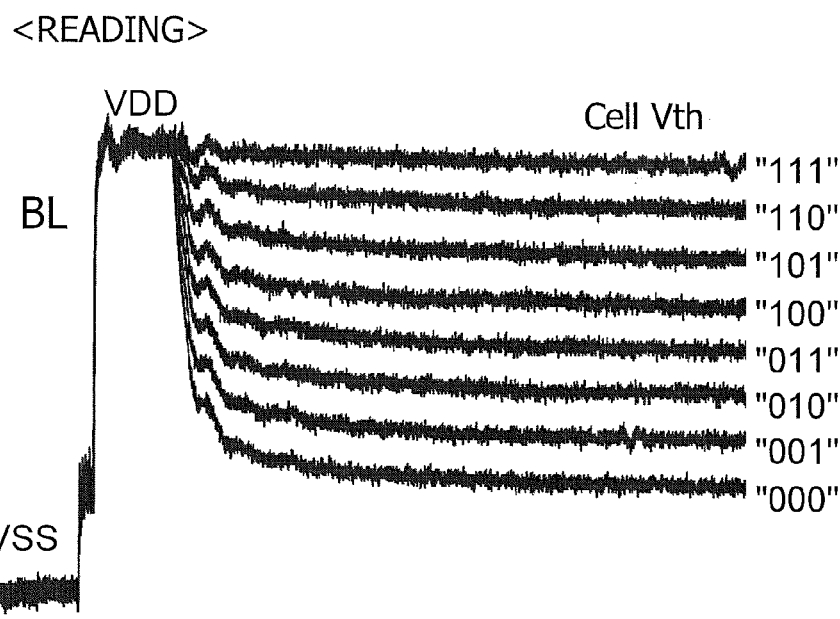
FIG. 18B shows waveforms of signals input to a bit line in a reading operation.

FIG. 18B shows the waveforms of output signals from the a BL in reading operation. Through the reading operation, a voltage corresponding to a voltage written to cells of a selected row is output from the BL and input as the signal VIN to seven comparators of the ADC. The seven comparators compare the input signal VIN with reference voltages (VREF1 to VREF7). The comparison results of the comparators are converted into 3-bit digital data by the encoder. The 3-bit digital signals output from the encoder are sampled by a LAT signal in the latch circuits.

The transistor M4 in the comparator is a CAAC-IGZO transistor, so that it can store data (correction voltage) for correcting an offset voltage in the comparator itself. Thus, in reading data of the whole 18-kbit NOSRAM cell array in the verification die, an operation of acquiring an offset correction voltage in the comparator is executed only once before execution of the reading operation.

<Verification Results of NOSRAM Cell>

Verification results of the operations of the NOSRAM cell will be described with reference to FIGS. 19A to 19C.

Figure 19A:
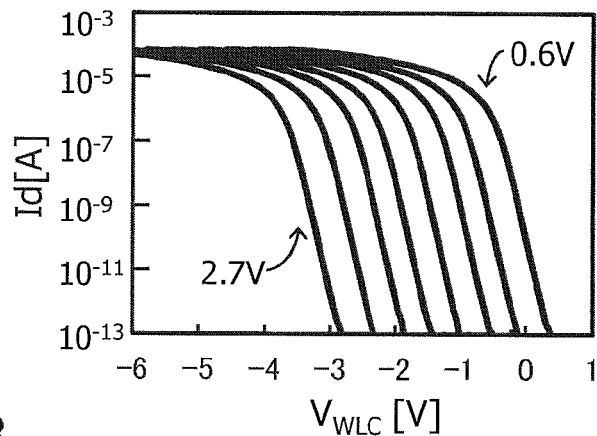
FIG. 19A shows voltage-current characteristics curves of a transistor in a memory cell.

FIG. 19A is a graph showing changes in the drain voltage Id of the transistor Mm2 with respect to the voltage $V_{WLC}$ of the WLc in the reading operation. That is, FIG. 19A shows current-voltage characteristics curves of the transistor Mm2. FIG. 19A shows results obtained by measuring Id of the NOSRAM cell to which voltages (0.6 V, 0.9 V, 1.2 V, 1.5 V, 1.8 V, 2.1 V, 2.4 V, and 2.7 V) corresponding to 3-bit data (digital code) are written.

In FIG. 19A, the leftmost curve shows Id with respect to a writing voltage of 2.7 V, and the rightmost curve shows Id with respect to a writing voltage of 0.6 V. FIG. 19A shows that the threshold voltage (Vth) of the transistor Mm2 is changed in accordance with a voltage written to the NOSRAM cell.

Figure 19B:
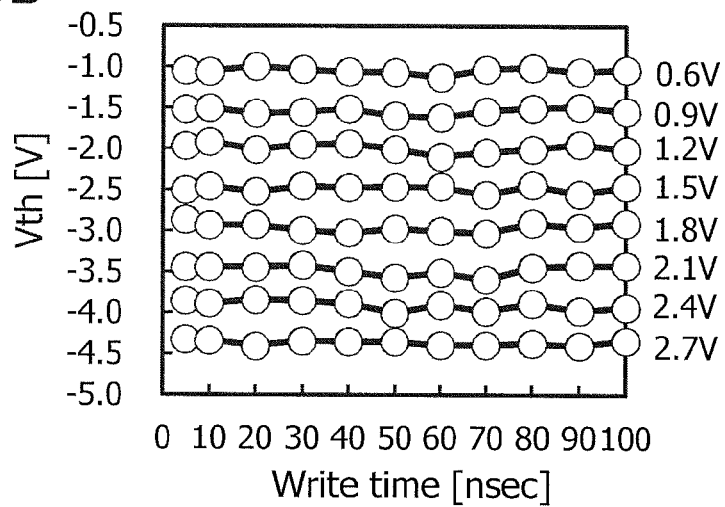
FIG. 19B is a graph showing changes in the threshold voltage of the transistor with respect to writing time.

FIG. 19B is a graph showing changes in the threshold voltage (Vth) with respect to writing time. Vth in FIG. 19B is a value obtained by calculation from current-voltage characteristics curves and writing time. Any of octal-value writing voltages was able to be stored in the capacitor Cm1 for 5 nsec.

Figure 19C:
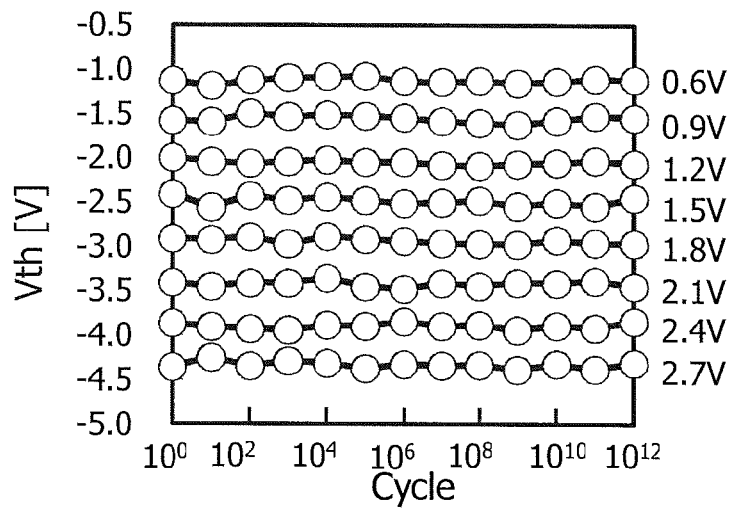
FIG. 19C is a graph showing write endurance of a memory cell.

FIG. 19C shows rewriting durability of the NOSRAM cell. The NOSRAM cell maintained Vth corresponding to an octal-value writing voltage even after $1 \times 10^{12}$ times of rewriting.

These results show that the NOSRAM cell was able to accurately store 3-bit data.

<Verification Results of ADC>

Figure 20A:
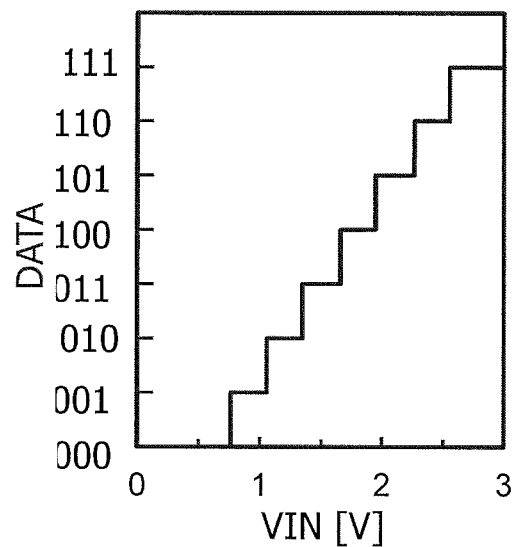
FIG. 20A is a graph showing conversion characteristics of an ADC.

FIG. 20A is a graph showing conversion characteristics of the ADC. The graph in FIG. 20A shows digital codes obtained by the ADC with respect to VIN input to the comparator. The reference voltages VREF1 to VREF7 applied to the comparators of the ADC were set to the median values of cell threshold voltages (cell Vth). Note that cell Vth refers to the voltage of a BL at the time of reading data and depends on a voltage written to a cell and the threshold voltage (Vth) of the transistor Mm2 (see FIG. 18B).

Figure 20B:
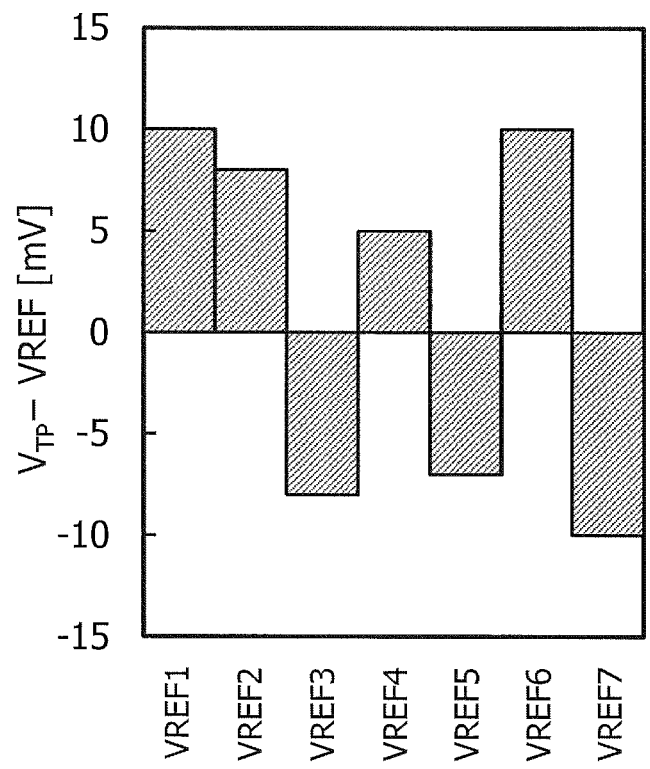
FIG. 20B is a graph showing a difference between reference voltage (VREF) of a comparator and a transition point voltage ($V_{TP}$).

FIG. 20B shows the performance of the ADC of the verification die. FIG. 20B is a graph showing a difference ($V_{TP}$–VREF) between the reference voltage (VREF) of the comparator and a transition point voltage $V_{TP}$. FIG. 20B shows that an error of the comparator in the verification die was able to be suppressed to approximately 10 mV. An error of a comparator without a function of correcting an offset voltage was approximately 30 mV. It is suggested that a highly accurate ADC can be provided according to this example.

This application is based on Japanese Patent Application serial no. 2013-052787 filed with Japan Patent Office on Mar. 15, 2013, the entire contents of which are hereby incorporated by reference.

What is claimed is:

1. A semiconductor device comprising:
a first circuit comprising a first terminal, a second terminal, and a first output terminal, the first circuit configured to output a potential corresponding to a difference between the first terminal and the second terminal; and
a second circuit comprising a third terminal and a second output terminal, the second circuit configured to amplify a potential being input from the third terminal,
wherein the first terminal and the second terminal are electrically connected to each other through a first transistor,
wherein the first output terminal is electrically connected to the third terminal, one of a source and a drain of a second transistor, and one of a source and a drain of a third transistor,
wherein another of the source and the drain of the third transistor is electrically connected to a gate of the second transistor and one electrode of a capacitor,
wherein a semiconductor layer of each of the first transistor and the second transistor comprises silicon, and
wherein a semiconductor layer of the third transistor comprises indium, gallium, and zinc.

2. The semiconductor device according to claim 1, wherein a gate of the first transistor and a gate of the third transistor are electrically connected to each other.

3. The semiconductor device according to claim 1, wherein another of the source and the drain of the second transistor and another electrode of the capacitor are electrically connected to each other.

4. The semiconductor device according to claim 1, wherein a reference potential is input to the first terminal.

5. The semiconductor device according to claim 1,
wherein the first terminal is electrically connected to one of a source and a drain of a fourth transistor,
wherein the second output terminal is electrically connected to one of a source and a drain of a fifth transistor, and
wherein a gate of the fourth transistor and a gate of the fifth transistor are electrically connected to each other.

6. The semiconductor device according to claim 5, wherein a semiconductor layer of each of the fourth transistor and the fifth transistor comprises silicon.

7. The semiconductor device according to claim 1, wherein the semiconductor layer of the third transistor comprises a region comprising c-axis aligned crystals.

8. The semiconductor device according to claim 1, wherein the first circuit is a differential circuit.

9. The semiconductor device according to claim 1, wherein the second circuit is a common source amplifier circuit or a source follower circuit.

10. A semiconductor device comprising:
a first circuit comprising a first terminal, a second terminal, and a first output terminal, the first circuit configured to output a potential corresponding to a difference between the first terminal and the second terminal; and
a second circuit comprising a third terminal and a second output terminal, the second circuit configured to amplify a potential being input from the third terminal,
wherein the first terminal and the second terminal are electrically connected to each other through a first transistor,
wherein the first output terminal is electrically connected to the third terminal, one of a source and a drain of a second transistor, and one of a source and a drain of a third transistor,
wherein another of the source and the drain of the third transistor is electrically connected to a gate of the second transistor and one electrode of a capacitor,
wherein a semiconductor layer of each of the first transistor and the second transistor comprises silicon, and
wherein a semiconductor layer of the third transistor comprises indium, tin, and zinc.

11. The semiconductor device according to claim 10, wherein a gate of the first transistor and a gate of the third transistor are electrically connected to each other.

12. The semiconductor device according to claim 10, wherein another of the source and the drain of the second transistor and another electrode of the capacitor are electrically connected to each other.

13. The semiconductor device according to claim 10, wherein a reference potential is input to the first terminal.

14. The semiconductor device according to claim 10,
wherein the first terminal is electrically connected to one of a source and a drain of a fourth transistor,
wherein the second output terminal is electrically connected to one of a source and a drain of a fifth transistor, and
wherein a gate of the fourth transistor and a gate of the fifth transistor are electrically connected to each other.

15. The semiconductor device according to claim 14, wherein a semiconductor layer of each of the fourth transistor and the fifth transistor comprises silicon.

16. The semiconductor device according to claim 10, wherein the semiconductor layer of the third transistor comprises a region comprising c-axis aligned crystals.

17. The semiconductor device according to claim 10, wherein the first circuit is a differential circuit.

18. The semiconductor device according to claim 10, wherein the second circuit is a common source amplifier circuit or a source follower circuit.

* * * * *